United States Patent
Hiyama

(10) Patent No.: US 9,461,640 B2
(45) Date of Patent: Oct. 4, 2016

(54) SWITCHING ELEMENT DRIVE CIRCUIT, POWER MODULE, AND AUTOMOBILE

(71) Applicant: Kazuaki Hiyama, Tokyo (JP)

(72) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/651,627

(22) PCT Filed: Dec. 21, 2012

(86) PCT No.: PCT/JP2012/083321
§ 371 (c)(1),
(2) Date: Jun. 11, 2015

(87) PCT Pub. No.: WO2014/097486
PCT Pub. Date: Jun. 26, 2014

(65) Prior Publication Data
US 2015/0318850 A1    Nov. 5, 2015

(51) Int. Cl.
*H02P 6/14* (2016.01)
*H03K 17/687* (2006.01)
*H03K 17/04* (2006.01)
(Continued)

(52) U.S. Cl.
CPC ............. *H03K 17/687* (2013.01); *H02M 1/08* (2013.01); *H02M 1/32* (2013.01); *H02P 6/14* (2013.01); *H03K 17/04* (2013.01); *H03K 17/163* (2013.01); *H03K 17/166* (2013.01); *H02M 7/003* (2013.01); *H02M 7/5387* (2013.01); *H02M 2001/0012* (2013.01)

(58) Field of Classification Search
CPC ...... H02M 3/156; H02M 3/155; H02M 1/08; H02P 6/14
See application file for complete search history.

(56) References Cited

U.S. PATENT DOCUMENTS

| 6,333,665 | B1 | 12/2001 | Ichikawa |
| 7,710,187 | B2 | 5/2010 | Hiyama |

(Continued)

FOREIGN PATENT DOCUMENTS

| JP | H04-029558 A | 1/1992 |
| JP | 2000-232347 A | 8/2000 |

(Continued)

OTHER PUBLICATIONS

Notification of Transmittal of Translation of the International Preliminary Report on Patentability and Translation of Written Opinion of the International Searching Authority; PCT/JP2012/083321 issued on Jul. 2, 2015.

(Continued)

*Primary Examiner* — Karen Masih
(74) *Attorney, Agent, or Firm* — Studebaker & Brackett PC

(57) ABSTRACT

A switching element drive circuit of the present invention outputs a voltage to the switching element by use of a voltage output unit configured as an amplifier circuit having a voltage amplification factor of 1 to drive the switching element. When the switching element is turned on, a turn-on voltage having a value higher than a threshold voltage of the switching element and lower than a value of a voltage of a power supply of the switching element drive circuit is provided to the voltage output unit. After elapse of a turn-on voltage maintenance period, a voltage provided to the voltage output unit is switched by a voltage switching unit to the voltage of the power supply of the switching element drive circuit.

9 Claims, 11 Drawing Sheets

(51) Int. Cl.
  *H03K 17/16*  (2006.01)
  *H02M 1/08*  (2006.01)
  *H02M 1/32*  (2007.01)
  *H02M 7/00*  (2006.01)
  *H02M 7/5387*  (2007.01)
  *H02M 1/00*  (2006.01)

(56) References Cited

U.S. PATENT DOCUMENTS 8,314,600 B2 * 11/2012 Chiang ............... H02M 3/156
  323/284
8,610,485 B2  12/2013  Hiyama

FOREIGN PATENT DOCUMENTS

| JP | 2000-253646 A | 9/2000 |
| JP | 2001-037207 A | 2/2001 |
| JP | 2003-189593 A | 7/2003 |
| JP | 2003-319638 A | 11/2003 |
| JP | 2007-089325 A | 4/2007 |
| JP | 2009-071956 A | 4/2009 |
| JP | 2012-165618 A | 8/2012 |
| JP | 2012-186998 A | 9/2012 |

OTHER PUBLICATIONS

An Office Action; "Notification of Reasons(s) for Refusal," issued by the Japanese Patent Office on Jun. 30, 2015, which corresponds to Japanese Patent Application No. 2014-552868 and is related to U.S. Appl. No. 14/651,627; with English language partial translation.

An Office Action issued by the Japanese Patent Office which corresponds to Patent Application No. 2014-552868 and is related to U.S. Appl. No. 14/651,627; with English language partial translation.

International Search Report, PCT/JP2012/083321, Apr. 2, 2013.

An Office Action issued by the Korean Patent Office on Jun. 13, 2016, which corresponds to Korean Patent Application No. 10-2015-7016243 and is related to U.S. Appl. No. 14/651,627; with English language translation.

* cited by examiner

F I G . 3
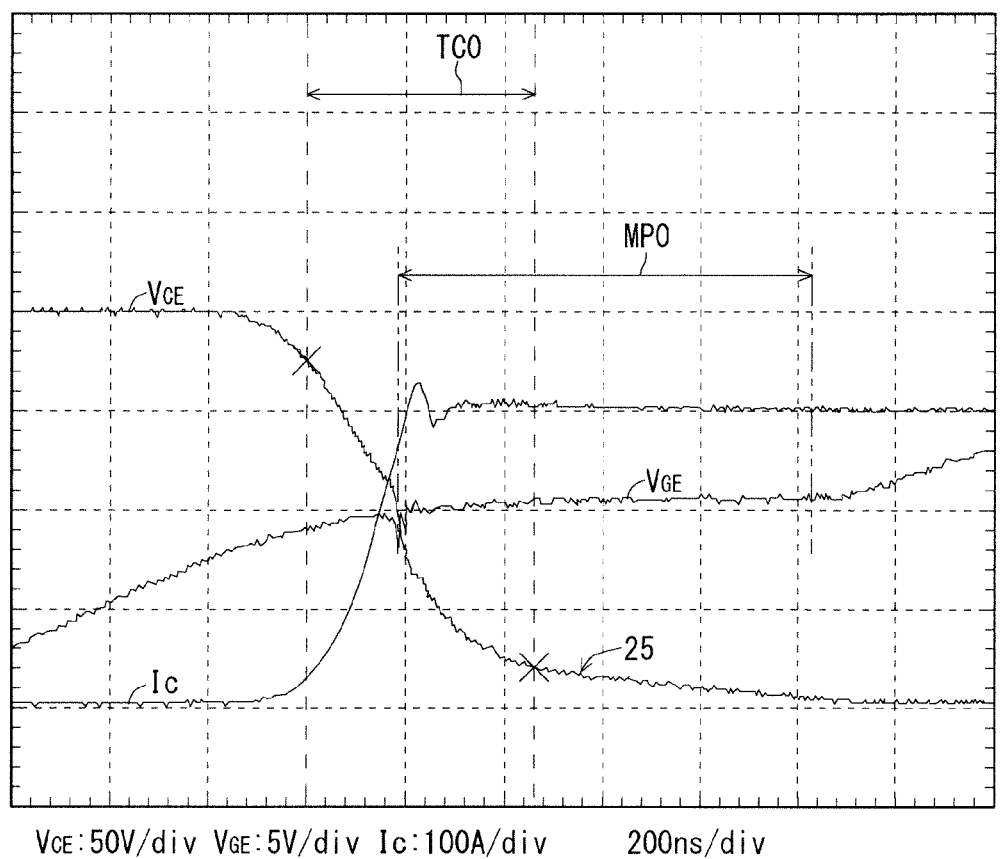

F I G . 4
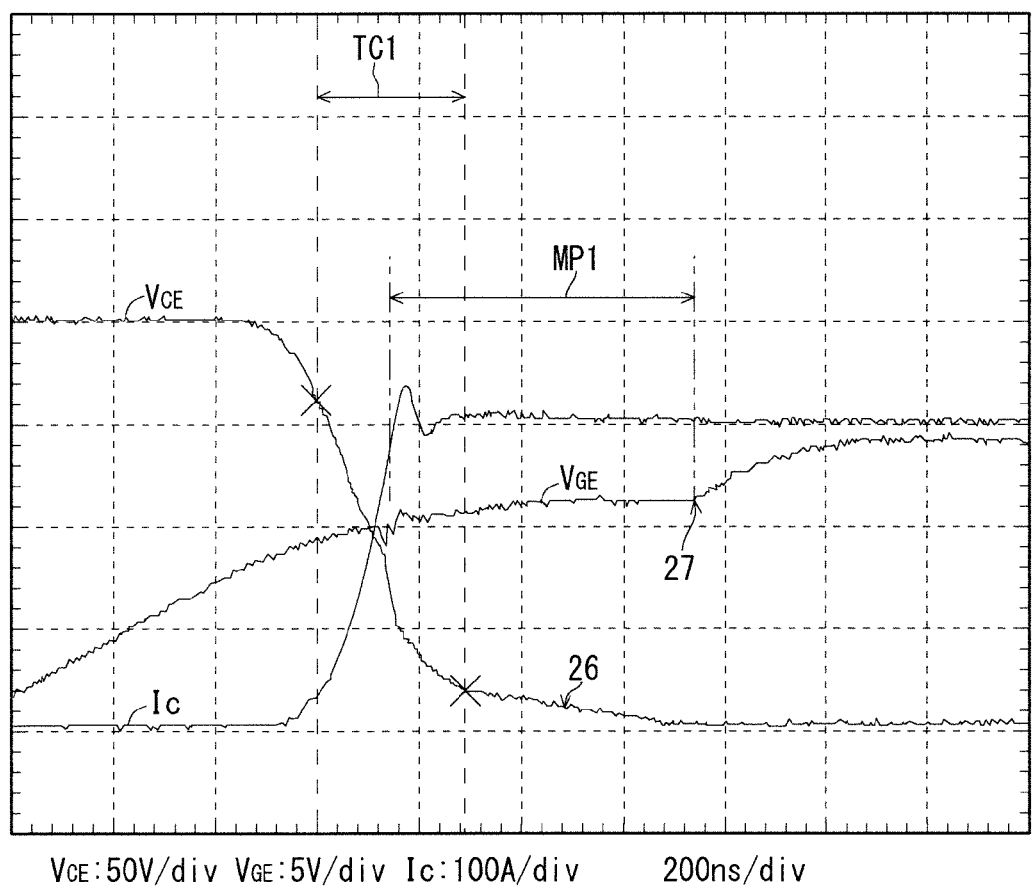

F I G. 9
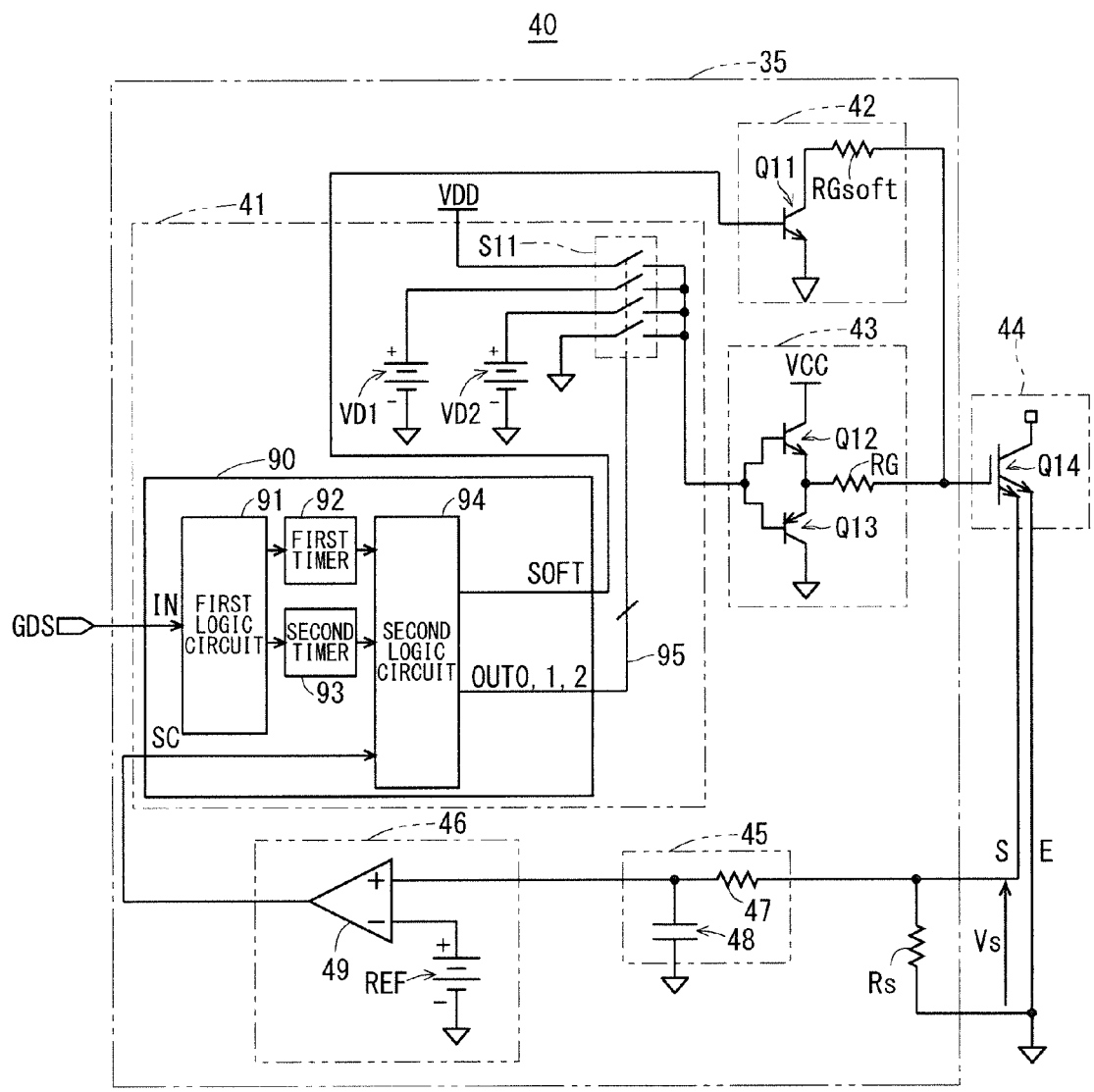

PRIOR ART

SWITCHING ELEMENT DRIVE CIRCUIT, POWER MODULE, AND AUTOMOBILE

TECHNICAL FIELD

The present invention relates to a switching element drive circuit that drives a power device of a voltage control type and the like that are used, in a power device circuit such as a power integrated circuit (IC), as switching elements for switching output, and further relates to a power module and an automobile each including the switching element drive circuit.

BACKGROUND ART

An inverter apparatus is provided with a power device circuit such as a bridge circuit. The bridge circuit includes a plurality of switching elements. As the switching elements, switching elements of a voltage control type (hereinafter, also referred to as "voltage control type switching elements"), such as insulated gate bipolar transistors (abbreviation: IGBTs) and metal-oxide-semiconductor field effect transistors (abbreviation: MOSFETs), are commonly used.

A circuit that controls a gate voltage of a voltage control type switching element is referred to as a switching element drive circuit (hereinafter, also simply referred to as a "drive circuit"). The drive circuit performs switching of the voltage control type switching element.

As disclosed in Patent Document 1, for example, the drive circuit outputs a power supply voltage of the drive circuit at turn-on of the voltage control type switching element (hereinafter, also referred to as a "switching element"), and outputs a voltage of 0 V or a negative voltage at turn-off of the switching element. The drive circuit includes a gate resistor, and is connected to the gate of the switching element via the gate resistor.

An increase in resistance of the gate resistor decreases rising and falling speeds of a gate voltage that is a voltage applied to the gate of the switching element, leading to a decrease in switching speed of the switching element. On the other hand, a decrease in resistance of the gate resistor increases the rising and falling speeds of the gate voltage, leading to an increase in switching speed of the switching element. As such, the drive circuit can control the switching speed of the switching element by use of the gate resistor.

Drive circuits to improve switching characteristics of switching elements and to suppress short circuit current are disclosed in Patent Documents 2-7, for example. For example, Patent Document 2 discloses a drive circuit in which an on-side circuit that performs a turn-on operation of a switching element and an off-side circuit that performs a turn-off operation of the switching element are each provided with two gate drive elements and a delay circuit, and the delay circuit switches between the gate drive elements, for the purpose of reducing a switching loss of the switching element. In the following description, the gate drive elements of the on-side circuit are also referred to as "on-side gate drive elements", and the gate drive elements of the off-side circuit are also referred to as "off-side gate drive elements".

When the switching element is turned on, the drive circuit disclosed in Patent Document 2 first gradually increases a gate voltage via a first on-side gate drive element and a gate resistor of the on-side circuit. The drive circuit then provides a voltage applied to a second on-side gate drive element to the gate of the switching element with some delay caused by the above-mentioned delay circuit to increase the gate voltage to a voltage in a steady state.

When the switching element is turned off, the drive circuit disclosed in Patent Document 2 first gradually decreases the gate voltage via a first off-side gate drive element and a gate resistor of the off-side circuit. The drive circuit then decreases the gate voltage to ground potential with some delay by use of the above-mentioned delay circuit and a second off-side gate drive element.

That is to say, the drive circuit disclosed in Patent Document 2 increases the gate voltage of the switching element in two stages by switching between a plurality of gate drive elements over time when the switching element is turned on, and decreases the gate voltage of the switching element in two stages by switching between a plurality of gate drive elements over time when the switching element is turned off. The gate voltage is thereby gradually changed.

Radiation noise is reduced by gradually changing the gate voltage as described above. Furthermore, a switching loss is reduced by suppressing a turn-on time that is a time required for the switching element to switch from an off state to an on state, and a turn-off time that is a time required for the switching element to switch from the on state to the off state.

Patent Document 7 discloses a drive circuit in which a power supply voltage or an input voltage is varied between an on-side circuit and an off-side circuit to achieve, in addition to reduction of a switching loss, suppression of arm short circuit current and load short circuit current in a case where switching elements are bridge-connected. The drive circuit disclosed in Patent Document 7 turns on the switching element at a relatively low voltage by use of the on-side circuit, thereby suppressing the arm short circuit current and the load short circuit current.

PRIOR ART DOCUMENT

Patent Document

Patent Document 1: Japanese Patent Application Laid-Open No. 4-29558
Patent Document 2: Japanese Patent Application Laid-Open No. 2001-37207
Patent Document 3: Japanese Patent Application Laid-Open No. 2000-232347
Patent Document 4: Japanese Patent Application Laid-Open No. 2003-189593
Patent Document 5: Japanese Patent Application Laid-Open No. 2000-253646
Patent Document 6: Japanese Patent Application Laid-Open No. 2003-319638
Patent Document 7: Japanese Patent Application Laid-Open No. 2012-186998

SUMMARY OF THE INVENTION

Problems to be Solved by the Invention

The drive circuits disclosed in Patent Documents 2-7 each include a plurality of gate drive elements to switch a gate resistor or a gate voltage for the purpose of improving switching characteristics of a switching element and suppressing short circuit current, for example.

A gate drive element is required to have a drive capability of about several amperes so as to be able to supply current for charge and discharge to the gate of the switching element, and thus has a die size, i.e., a chip area, corresponding to the drive capability. This results in a problem of an increase in chip size, heating, and an increase in manufacturing cost of an IC in a case where a plurality of gate drive elements are integrated into a single IC.

In order to avoid this problem, discrete semiconductor elements, such as transistors, not integrated into an IC are used as gate drive elements in a case where a plurality of gate drive elements are used. Use of discrete semiconductor elements as the gate drive elements, however, causes a problem in that a mounting area of a drive circuit increases with increasing number of discrete semiconductor elements, and the drive circuit may not fit in a printed circuit board on which the drive circuit is to be mounted.

It is an object of the present invention to provide a switching element drive circuit that can achieve improvement of switching characteristics of a switching element of a voltage control type and suppression of short circuit current with a relatively small mounting area, and further to provide a power module and an automobile each including the switching element drive circuit.

Means for Solving the Problems

A switching element drive circuit of the present invention is a switching element drive circuit that drives a switching element of a voltage control type, the switching element being switched from an off state to an on state by application of a voltage that is equal to or higher than a threshold voltage to a control electrode, the switching element drive circuit including: a voltage output unit outputting a voltage to the switching element; and a voltage switching unit switching a voltage provided to the voltage output unit, wherein the voltage output unit is configured as an amplifier circuit having a voltage amplification factor of 1, and in performing a turn-on operation of switching the switching element from the off state to the on state, the voltage switching unit provides the voltage output unit with a turn-on voltage having a value that is higher than the threshold voltage of the switching element and is lower than a value of a voltage of a power supply of the switching element drive circuit, and, when a predetermined turn-on voltage maintenance period has elapsed since the provision of the turn-on voltage, switches the voltage provided to the voltage output unit to the voltage of the power supply of the switching element drive circuit.

A power module of the present invention includes a power device circuit that includes: the switching element drive circuit of the present invention; and the switching element driven by the switching element drive circuit.

An automobile of the present invention includes: the switching element drive circuit of the present invention; and an inverter apparatus including the switching element, and driving a motor.

Effects of the Invention

According to the switching element drive circuit of the present invention, in performing the turn-on operation of switching the switching element from the off state to the on state, the turn-on voltage is provided to the voltage output unit, and the voltage switching unit then switches, when the turn-on voltage maintenance period has elapsed, the voltage provided to the voltage output unit to the voltage of the power supply of the switching element drive circuit. As a result, when the turn-on operation of switching the switching element from the off state to the on state is performed, after the turn-on voltage is temporarily output from the voltage output unit to the switching element, the voltage of the power supply of the switching element drive circuit can be output. Since the value of the turn-on voltage is higher than the threshold voltage of the switching element, and is lower than the value of the voltage of the power supply of the switching element drive circuit, short circuit current at turn-on can be suppressed so as to be low.

In addition, the voltage switching unit can easily be integrated. Since the voltage amplification factor of the voltage output unit is 1, the voltage output unit can be configured from relatively few circuit components. Switching characteristics of a switching element and suppression of short circuit current can thus be achieved with a relatively small mounting area.

According to the power module of the present invention, switching characteristics of a switching element and suppression of short circuit current can be achieved with a relatively small mounting area.

According to the automobile of the present invention, destruction of the switching element included in the inverter apparatus can be prevented, and failure of the inverter apparatus can be prevented.

These and other objects, features, aspects and advantages of the present invention will become more apparent from the following detailed description and the accompanying drawings.

BRIEF DESCRIPTION OF DRAWINGS

FIG. 3 shows measured waveforms at turn-on in a switching element drive circuit 81 in underlying technology.

FIG. 4 shows measured waveforms at turn-on in the switching element drive circuit 1 in Embodiment 1 of the present invention.

FIG. 9 shows configuration of a power device circuit 40 including a drive circuit 35 that is a switching element drive circuit in Embodiment 2 of the present invention.

DESCRIPTION OF EMBODIMENTS

Underlying Technology

Figure 13:
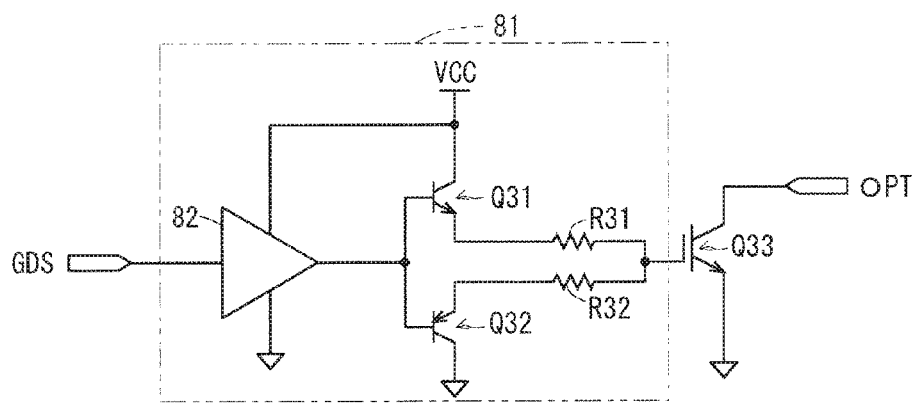
FIG. 13 shows configuration of a power device circuit 80 including the switching element drive circuit 81 in the underlying technology.

Before description on switching element drive circuits in embodiments of the present invention, a switching element drive circuit in technology that underlies the present invention is described. FIG. 13 shows configuration of a power device circuit 80 including a switching element drive circuit 81 in the underlying technology. The power device circuit 80 includes a power device Q33 that is a switching element of a voltage control type, and the switching element drive circuit 81 (hereinafter, also simply referred to as a "drive circuit") that drives the power device Q33.

In the underlying technology, the drive circuit 81 is a drive circuit that drives the gate of the power device Q33, which is the switching element of the voltage control type, and the power device Q33 is an insulated gate bipolar transistor (abbreviation: IGBT). In the following description, the power device Q33 is also referred to as an "IGBT Q33".

The drive circuit 81 includes a buffer amplifier 82, a power supply VCC, an NPN bipolar transistor (hereinafter, simply referred to as an "NPN transistor") Q31, a PNP bipolar transistor (hereinafter, simply referred to as a "PNP transistor") Q32, a first gate resistor R31, and a second gate resistor R32. The NPN transistor Q31 and the PNP transistor Q32 correspond to gate drive elements.

A gate drive signal GDS is input into an input terminal of the buffer amplifier 82. The buffer amplifier 82 is connected to the power supply VCC of the drive circuit 81 and to ground. An output terminal of the buffer amplifier 82 is connected to the base of the NPN transistor Q31 and the base of the PNP transistor Q32. The bases of the NPN transistor Q31 and the PNP transistor Q32 are commonly connected.

The collector of the NPN transistor Q31 is connected to the power supply VCC of the drive circuit 81. The emitter of the NPN transistor Q31 is connected to the gate of the IGBT Q33 via the first gate resistor R31. The emitter of the PNP transistor Q32 is connected to the gate of the IGBT Q33 via the second gate resistor R32. The collector of the PNP transistor Q32 is connected to ground.

The collector of the IGBT Q33 is connected to an output terminal. The collector of the IGBT Q33 outputs an output signal OPT from the output terminal. The emitter of the IGBT Q33 is connected to ground.

The drive circuit 81 performs switching of the IGBT Q33. The drive circuit 81 outputs a voltage of the power supply VCC of the drive circuit 81 at turn-on, and outputs a voltage of 0 V or a negative voltage at turn-off.

An increase in resistance of the first and second gate resistors R31 and R32 decreases rising and falling speeds of a gate voltage of the IGBT Q33, leading to a decrease in switching speed of the IGBT Q33. A decrease in resistance of the first and second gate resistors R31 and R32 increases the rising and falling speeds of the gate voltage of the IGBT Q33, leading to an increase in switching speed of the IGBT Q33. The switching speed of the IGBT Q33 can thus be controlled by use of the first and second gate resistors R31 and R32.

In the drive circuit 81, the NPN transistor Q31 performs a turn-on operation of the IGBT Q33, and the PNP transistor Q32 performs a turn-off operation of the IGBT Q33.

In turning on the IGBT Q33, the drive circuit 81 switches the NPN transistor Q31 to an on state, switches the PNP transistor Q32 to an off state, and provides the voltage of the power supply VCC via the first gate resistor R31 to increase the gate voltage of the IGBT Q33 to a voltage in a steady state.

In turning off the IGBT Q33, the drive circuit 81 switches the NPN transistor Q31 to an off state, switches the PNP transistor Q32 to an on state, and decreases the gate voltage of the IGBT Q33 to ground potential via the second gate resistor R32.

Figure 14:
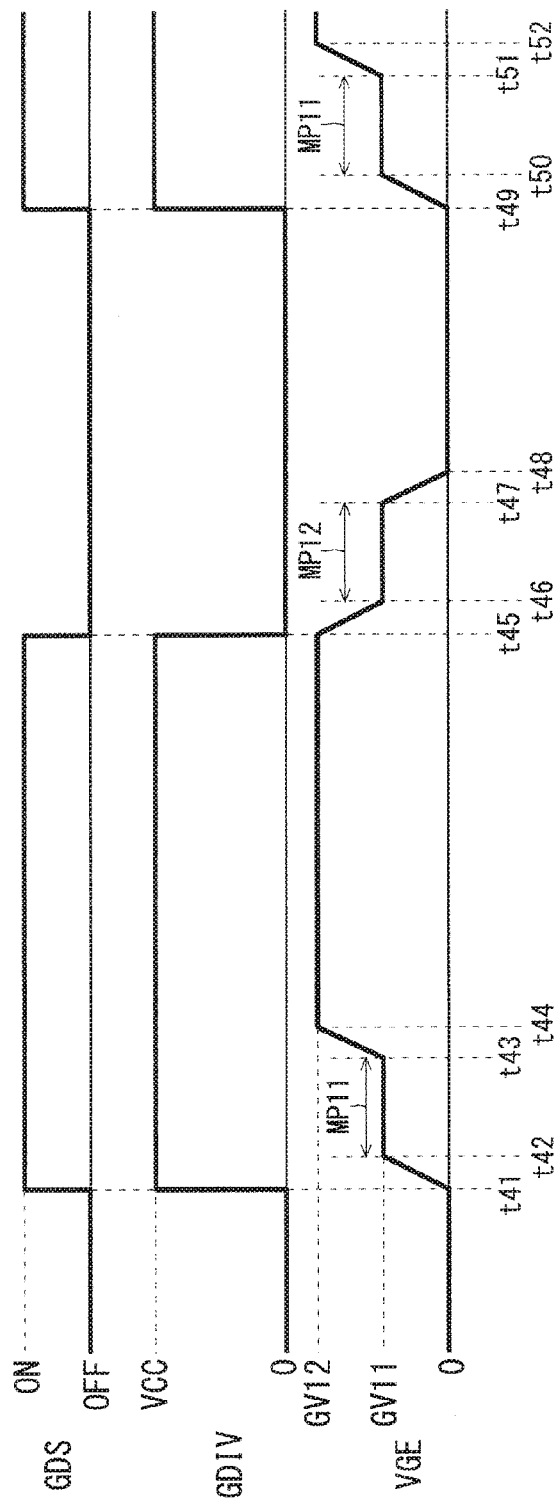
FIG. 14 is a timing diagram showing an operation of the power device circuit 80 shown in FIG. 13.

FIG. 14 is a timing diagram showing an operation of the power device circuit 80 shown in FIG. 13. The horizontal axis in FIG. 14 represents time.

When the gate drive signal GDS switches from an off (OFF) signal to an on (ON) signal at time t41, a signal level of a voltage (hereinafter, referred to as a "gate drive element input voltage GDIV") input into the NPN transistor Q31 and the PNP transistor Q32, which are gate drive elements, switches from a low (L) level to a high (H) level, specifically, to a voltage value (shown as "VCC" in FIG. 14) of the power supply VCC.

As a result, the NPN transistor Q31 is switched to the on state, the PNP transistor Q32 is switched to the off state, and the voltage of the power supply VCC is provided to the IGBT Q33 via the first gate resistor R31, so that a gate voltage VGE of the IGBT Q33 starts to increase at time t41. The gate voltage VGE of the IGBT Q33 once increases to a first gate voltage value GV11. When the gate voltage VGE of the IGBT Q33 reaches the first gate voltage value GV11 at time t42, the gate voltage VGE of the IGBT Q33 is maintained at the first gate voltage value GV11 during a mirror period MP11 from time t42 to time t43.

At time t43 when the mirror period MP11 for the IGBT Q33 ends, the gate voltage VGE of the IGBT Q33 starts to increase again. The gate voltage VGE of the IGBT Q33 increases to the voltage value of the power supply VCC, which is a second gate voltage value GV12.

At time t44, the gate voltage VGE of the IGBT Q33 reaches the second gate voltage value GV12. The gate voltage VGE of the IGBT Q33 is maintained at the second gate voltage value GV12 during an on-state period from time t44 to time t45.

When the gate drive signal GDS switches from the on signal to the off signal at time t45, the signal level of the gate drive element input voltage GDIV switches from the H level to the L level, specifically, to ground potential (0 V). As a result, the NPN transistor Q31 is switched to an off state, the PNP transistor Q32 is switched to an on state, and the gate voltage VGE of the IGBT Q33 starts to decrease via the second gate resistor R32. The gate voltage VGE of the IGBT Q33 once decreases to the first gate voltage value GV11.

At time t46, the gate voltage VGE of the IGBT Q33 reaches the first gate voltage value GV11. The gate voltage VGE of the IGBT Q33 is maintained at the first gate voltage value GV11 during a mirror period MP12 from time t46 to time t47. At time t47 when the mirror period MP12 ends, the gate voltage VGE of the IGBT Q33 starts to decrease again. The gate voltage VGE of the IGBT Q33 decreases to ground potential, i.e., 0 V.

At time t48, the gate voltage value of the gate voltage VGE of the IGBT Q33 reaches 0 V. The gate voltage VGE of the IGBT Q33 is maintained at 0 V during an off-state period from time t48 to time t49.

When the gate drive signal GDS switches from the off signal to the on signal again at time t49, the signal level of the gate drive element input voltage GDIV switches from the L level to the H level, and the gate voltage VGE of the IGBT Q33 starts to increase. After the gate voltage VGE of the IGBT Q33 has increased to the first gate voltage value GV11 at time t50, the gate voltage VGE of the IGBT Q33 is maintained at the first gate voltage value GV11 during the mirror period MP11 from time t50 to time t51.

At time t51 when the mirror period MP11 ends, the gate voltage VGE of the IGBT Q33 starts to increase again, and increases until it becomes the second gate voltage value GV12 at time t52. After time t49, an operation from time t41 to time t49 is repeated as described above.

The following describes the mirror periods MP11 and MP12. Immediately after turn-on and immediately after turn-off of the switching element, there are the mirror periods MP11 and MP12 during which the gate voltage VGE is maintained at a constant value. During the mirror periods MP11 and MP12, feedback capacitance between the collector and the emitter changes with a decrease of a collector voltage, and displacement current generated by the change flows from the gate toward the feedback capacitance. Thus, in the drive circuit 81 shown in FIG. 13, gate current flowing from the drive circuit 81 to the gate of the IGBT Q33, and the gate voltage become approximately constant during the mirror periods MP11 and MP12.

The duration of the mirror periods MP11 and MP12 is about several microseconds. The duration of the mirror periods MP11 and MP12 can be changed to some extent with use of an output voltage of the drive circuit 81 and resistance of the first and second gate resistors R31 and R32. Specifically, at turn-on, the mirror period MP11 becomes shorter when the gate current is increased by increasing the output voltage of the drive circuit 81 or by decreasing the resistance of the first gate resistor R31. On the other hand, the mirror period MP11 becomes longer when the gate current is decreased by decreasing the output voltage of the drive circuit 81 or by increasing the resistance of the first gate resistor R31.

Collector current $I_C$ flowing between the emitter and the collector of the IGBT Q33 increases significantly with an increase in the gate voltage VGE during a period (t41 to t42) of transition of the gate voltage VGE from 0 V to GV11 within a turn-on period, and thus a surge voltage and radiation noise resulting from the change of the collector current $I_C$ occur mainly during the period from time t41 to time t42.

In order to suppress the surge voltage and the radiation noise, a speed at which the gate voltage VGE increases during the period from time t41 to time t42 is required to be reduced.

The speed at which the gate voltage VGE increases during the period from time t41 to time t42 can be reduced by increasing the resistance of the first gate resistor R31 in the drive circuit 81 in the underlying technology. However, the mirror period MP11 from time t42 to time t43 and a period from time t43 to time t44 also become longer, and the turn-on period from time t41 to time t44 becomes longer, resulting in an increase in turn-on loss.

In the drive circuit 81 in the underlying technology, in performing the turn-on operation of the IGBT Q33, the NPN transistor Q31, which is a gate drive element, is turned on, and the gate voltage of the IGBT Q33 is increased via the first gate resistor R31 to the voltage value of the power supply VCC to switch the IGBT Q33 to the on state.

In this case, if the resistance of the first gate resistor R31 is low, the period in which the gate voltage of the IGBT Q33 increases from 0 V to GV11 (t41 to t42), the mirror period MP11 for the IGBT Q33 (t42 to t43), and the period in which the gate voltage of the IGBT Q33 increases from GV11 to GV12 (t43 to t44) each become short, and a turn-on time (t41 to t44) in which the IGBT Q33 is switched from the off state to the on state also becomes short. In this case, however, the surge voltage and the radiation noise cannot be suppressed.

To address this problem, the drive circuits disclosed in Patent Documents 2-7 described above each include a plurality of gate drive elements to switch the gate resistor or the gate voltage for the purpose of improving switching characteristics of a power device and suppressing short circuit current.

A gate drive element, however, is required to have a drive capability of about several amperes so as to be able to supply current for charge and discharge to the gate of the power device, and thus has a die size, i.e., a chip area, corresponding to the drive capability. This results in a problem of an increase in chip size, heating, and an increase in manufacturing cost of an IC when a plurality of gate drive elements are integrated into a single IC as with the drive circuits disclosed in Patent Documents 2-7 described above.

In order to avoid this problem, discrete semiconductor elements, such as transistors, not integrated into an IC are used as gate drive elements when a plurality of gate drive elements are used. Use of discrete semiconductor elements as the gate drive elements, however, causes a problem in that a mounting area of a drive circuit increases with increasing number of discrete semiconductor elements, and the drive circuit may not fit in a printed circuit board on which the drive circuit is to be mounted.

To address this problem, a switching element drive circuit of the present invention has configuration in each embodiment shown below.

Embodiment 1

Figure 1:
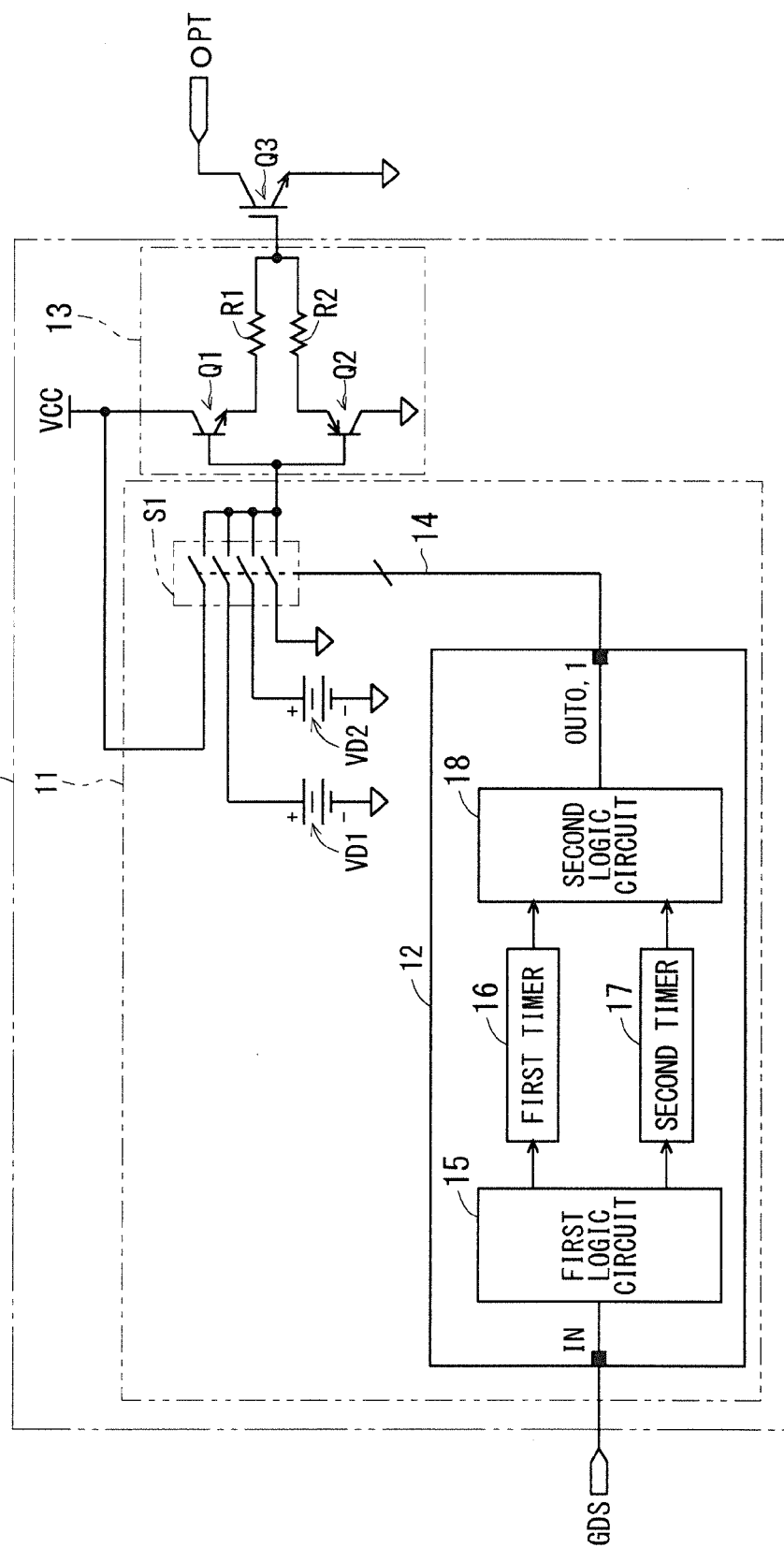
FIG. 1 shows configuration of a power device circuit 10 including a drive circuit 1 that is a switching element drive circuit in Embodiment 1 of the present invention.

FIG. 1 shows configuration of a power device circuit 10 including a drive circuit 1 that is a switching element drive circuit in Embodiment 1 of the present invention.

The power device circuit 10 includes the drive circuit 1 and an IGBT Q3 that is a voltage control type power device. The IGBT Q3, which is the voltage control type power device, is a switching element of a voltage control type. The IGBT Q3 is switched from an off state to an on state by application of a voltage that is equal to or higher than a gate threshold voltage to the gate that corresponds to a control electrode.

The drive circuit 1 includes a voltage switching unit 11, a power supply VCC, an NPN transistor Q1, a PNP transistor Q2, a first gate resistor R1, and a second gate resistor R2. The NPN transistor Q1 and the PNP transistor Q2 are gate drive elements. The NPN transistor Q1, the PNP transistor Q2, the first gate resistor R1, and the second gate resistor R2 function as a voltage output unit 13.

The voltage output unit (hereinafter, also referred to as a "gate drive circuit") 13 is an amplifier circuit in which the NPN transistor Q1 and the PNP transistor Q2 are configured as an emitter follower. The gate drive circuit 13, which is the amplifier circuit, has a voltage amplification factor of 1. That is to say, the voltage output unit 13 outputs the same voltage as output of the voltage switching unit 11 to the IGBT Q3. The gate drive circuit 13 controls a gate voltage of the IGBT Q3 to turn on or off the IGBT Q3.

The voltage switching unit 11 includes a control logic circuit 12, a first voltage source VD1, a second voltage source VD2, and a switching circuit S1. The control logic circuit 12 controls the switching circuit S1.

The control logic circuit 12 includes an input terminal IN and two output terminals OUT0 and OUT1. A gate drive signal GDS for driving the IGBT Q3 is input into the input terminal IN of the control logic circuit 12. Output signals output from the output terminals OUT0 and OUT1 of the control logic circuit 12 are provided to the switching circuit S1 via a bus 14 composed of two signal lines.

The control logic circuit 12 incorporates therein two logic circuits, i.e., a first logic circuit 15 and a second logic circuit 18, and two timers, i.e., a first timer TM1 16 and a second timer TM2 17. The first timer TM1 16 corresponds to a turn-on timer, and the second timer TM2 17 corresponds to a turn-off timer.

The switching circuit S1 includes four analog switches. Respective first ends of the four analog switches of the switching circuit S1 are connected to the power supply VCC of the drive circuit 1, the first voltage source VD1, the second voltage source VD2, and ground. Second ends of the four analog switches of the switching circuit S1 are connected to the bases of the NPN transistor Q1 and the PNP transistor Q2. The four analog switches of the switching circuit S1 are switched based on the output signals output from the output terminals OUT0 and OUT1 of the control logic circuit 12 so that any one of the analog switches is turned on, and the other analog switches are turned off.

The bases of the NPN transistor Q1 and the PNP transistor Q2 are commonly connected. The collector of the NPN transistor Q1 is connected to the power supply VCC of the drive circuit 1. The emitter of the NPN transistor Q1 is connected to the gate of the IGBT Q3 via the first gate resistor R1. The emitter of the PNP transistor Q2 is connected to the gate of the IGBT Q3 via the second gate resistor R2. The collector of the PNP transistor Q2 is connected to ground. The collector of the IGBT Q3 is connected to an output terminal. The emitter of the IGBT Q3 is connected to ground.

The following describes an operation of the gate drive circuit 13 of the drive circuit 1 in the present embodiment shown in FIG. 1. When a voltage that is higher than a gate voltage VGE of the IGBT Q3 is applied to the bases of the NPN transistor Q1 and the PNP transistor Q2, base current flows as the base of the NPN transistor Q1 is forward-biased, and the NPN transistor Q1 is turned on. In this case, the PNP transistor Q2 is maintained in an off state as the base of the PNP transistor Q2 is reverse-biased.

When the gate voltage VGE of the IGBT Q3 increases, and approaches a base voltage of the NPN transistor Q1, the base current of the NPN transistor Q1 stops flowing, and the NPN transistor Q1 is switched to an off state.

In a typical bipolar transistor, base current flows when a bias voltage of the base becomes a base forward bias voltage VBE. Thus, when the voltage that is higher than the gate voltage VGE of the IGBT Q3 is applied to the bases of the NPN transistor Q1 and the PNP transistor Q2, the gate voltage VGE of the IGBT Q3 increases to a voltage that is lower than the base voltages of the NPN transistor Q1 and the PNP transistor Q2 by the base forward bias voltage VBE. The base forward bias voltage VBE of a typical bipolar transistor is approximately 0.6 V.

Next, when a voltage that is lower than the gate voltage VGE of the IGBT Q3 is applied to the bases of the NPN transistor Q1 and the PNP transistor Q2, the NPN transistor Q1 is switched to an off state as the base of the NPN transistor Q1 is reverse-biased. As the base of the PNP transistor Q2 is forward-biased, base current flows, and the PNP transistor Q2 is turned on. When the gate voltage VGE of the IGBT Q3 decreases to a voltage that is higher than the base voltages of the NPN transistor Q1 and the PNP transistor Q2 by the base forward bias voltage VBE, the base current of the PNP transistor Q2 stops flowing, and the PNP transistor Q2 is turned off.

The amplitude of the gate voltage VGE of the IGBT Q3 is narrower than the amplitude of the base voltages, which are voltages applied to the bases of the NPN transistor Q1 and the PNP transistor Q2, by the base forward bias voltages VBE of the NPN transistor Q1 and the PNP transistor Q2.

For example, when the amplitude of the base voltages applied to the NPN transistor Q1 and the PNP transistor Q2 ranges from VL to VH, and a value of the base forward bias voltages VBE of the NPN transistor Q1 and the PNP transistor Q2 is "VBE", the amplitude of the gate voltage VGE of the IGBT Q3 ranges from "VL+VBE" to "VH−VBE".

When the base forward bias voltages VBE of the NPN transistor Q1 and the PNP transistor Q2 are sufficiently lower than the base voltages applied to the NPN transistor Q1 and the PNP transistor Q2, e.g., voltages of up to 15 V, an operation is performed so that the gate voltage VGE of the IGBT Q3 follows the base voltages applied to the NPN transistor Q1 and the PNP transistor Q2. That is to say, the voltage output unit 13 that includes the NPN transistor Q1, the PNP transistor Q2, the first gate resistor R1, and the second gate resistor R2 functions as an amplifier circuit having a voltage amplification factor of 1.

As a result, when any of a voltage V0 of the power supply VCC of the drive circuit 1, a voltage V1 of the first voltage source VD1, and a voltage V2 of the second voltage source VD2 is applied to the voltage output unit 13 that includes the NPN transistor Q1, the PNP transistor Q2, the first gate resistor R1, and the second gate resistor R2, an output voltage of the voltage output unit 13 becomes the voltage V0 of the power supply VCC of the drive circuit 1, the voltage V1 of the first voltage source VD1, or the voltage V2 of the second voltage source VD2, and is applied to the gate of the IGBT Q3.

When a voltage (hereinafter, also referred to as a "gate voltage") across the gate and the emitter of the IGBT Q3 exceeds a predetermined threshold (hereinafter, also referred to as a "gate threshold voltage") Vth, the IGBT Q3 is turned on.

In the present embodiment, a signal at the H level that is supplied, as an on signal, to the bases of the NPN transistor Q1 and the PNP transistor Q2 is the voltage V0 of the power supply VCC of the drive circuit 1, the voltage V1 of the first voltage source VD1, or the voltage V2 of the second voltage source VD2. A signal at the L level that is supplied, as an off signal, to the bases of the NPN transistor Q1 and the PNP transistor Q2 is ground potential, i.e., ground potential of 0 V.

In the present embodiment, if the gate drive circuit 13 applies or outputs a voltage to the gate of the IGBT Q3, the gate voltage VGE of the IGBT Q3 does not necessarily immediately follow the applied voltage (hereinafter, also referred to as an "output voltage") from the gate drive circuit 13, and become equal to the applied voltage.

For example, in the mirror period at turn-on of the IGBT Q3, the gate voltage VGE of the IGBT Q3 remains at a voltage value that is different from the applied voltage for a while.

Figure 2:
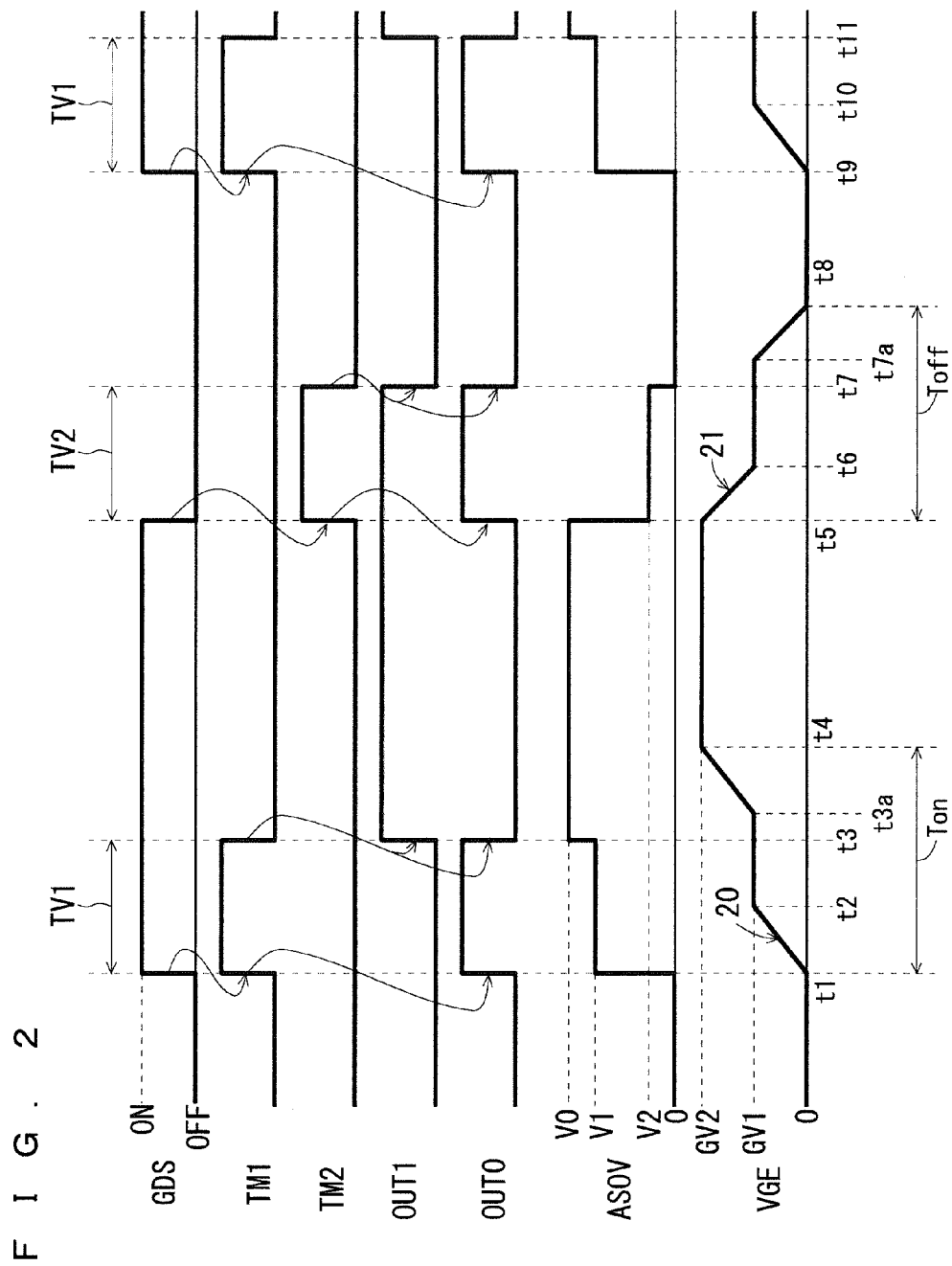
FIG. 2 is a timing diagram showing an operation of the power device circuit 10 shown in FIG. 1.

FIG. 2 is a timing diagram showing an operation of the power device circuit 10 shown in FIG. 1. The horizontal axis in FIG. 2 represents time. In FIG. 2, a delay of a signal output from each unit of the drive circuit 1 and the like is ignored to facilitate understanding.

For example, at time t1, the gate drive signal GDS rises, and switches from the off (OFF) signal to the on (ON) signal. In response to the rise of the gate drive signal GDS, a signal level of the first timer TM1 16 switches from the low (L) level to the high (H) level. The rise herein refers to a rise of a signal level from the L level to the H level.

The signal level of the first timer TM1 16 switches from the H level to the L level at time t3 after the elapse of a predetermined first maintenance period TV1. The first maintenance period TV1 corresponds to a turn-on voltage maintenance period.

For example, at time t5, the gate drive signal GDS falls, and switches from the on signal to the off signal. In response to the fall of the gate drive signal GDS, a signal level of the second timer TM2 17 switches from the L level to the H level. The fall herein refers to a fall of a signal level from the H level to the L level. The signal level of the second timer TM2 17 falls, and switches from the H level to the L level at time t7 after the elapse of a predetermined second maintenance period TV2. The second maintenance period TV2 corresponds to a turn-off voltage maintenance period.

An initial value of a signal level of an output signal from the output terminal (hereinafter, also referred to as a "first output terminal") OUT0, which is one of the two output terminals of the control logic circuit 12, is the L level, and the signal level is reversed in response to a rise and a fall of signals of the first and second timers TM1 16 and TM2 17.

For example, at time t1 and time t9, the signal level of the output signal from the first output terminal OUT0 of the control logic circuit 12 switches from the L level to the H level in response to the rise of the signal of the first timer TM1 16. At time t3 and time t11, the signal level of the output signal from the first output terminal OUT0 of the control logic circuit 12 switches from the H level to the L level in response to the fall of the signal of the first timer TM1 16.

At time t5, the signal level of the output signal from the first output terminal OUT0 of the control logic circuit 12 switches from the L level to the H level in response to the rise of the signal of the second timer TM2 17. At time t7, the signal level of the output signal from the first output terminal OUT0 of the control logic circuit 12 switches from the H level to the L level in response to the fall of the signal of the second timer TM2 17.

An initial value of a signal level of an output signal from the output terminal (hereinafter, also referred to as a "second output terminal") OUT1, which is the other one of the two output terminals of the control logic circuit 12, is the L level, and the signal level is reversed in response to the fall of the signals of the first and second timers TM1 16 and TM2 17.

For example, at time t3 and time t11, the signal level of the output signal from the second output terminal OUT1 of the control logic circuit 12 switches from the L level to the H level in response to the fall of the signal of the first timer TM1 16. At time t7, the signal level switches from the H level to the L level in response to the fall of the signal of the second timer TM2 17.

Values of voltages input into the switching circuit S1 have a relation 0<V2<Vth<V1<V0. Here, V0 represents a voltage value of the power supply VCC of the drive circuit 1. V1 represents a voltage value of the first voltage source VD1. V2 represents a voltage value of the second voltage source VD2. Vth represents the gate threshold voltage of the IGBT Q3. The voltage of the first voltage source VD1 corresponds to a turn-on voltage, and the voltage value V1 of the first voltage source VD1 corresponds to a value of the turn-on voltage. The voltage of the second voltage source VD2 corresponds to a turn-off voltage, and the voltage value V2 of the second voltage source VD2 corresponds to a value of the turn-off voltage.

A relation among the signal levels of the signals output from the first and second output terminals OUT0 and OUT1 of the control logic circuit 12, and an output voltage ASOV of the switching circuit S1 is shown in Table 1. The four analog switches constituting the switching circuit S1 are switched in response to the output signals output from the first and second output terminals OUT0 and OUT1 of the control logic circuit 12. The switching circuit S1 outputs, as the output voltage ASOV, any of ground potential of 0 V, the voltage value V0 of the power supply VCC, the voltage value V1 of the first voltage source VD1, and the voltage value V2 of the second voltage source VD2 in accordance with a connection state of the analog switches, as shown in Table 1.

TABLE 1

| OUT1 | OUT0 | ASOV | REMARKS |
|------|------|------|---------|
| L | L | 0 V | IGBT OFF |
| L | H | V1 | IGBT TURN-ON PERIOD |
| H | L | V0 | IGBT ON |
| H | H | V2 | IGBT TURN-OFF PERIOD |

When the signal level of the output signal from the second output terminal OUT1 is the L level, and the signal level of the output signal from the first output terminal OUT0 is the L level, the output voltage ASOV of the switching circuit S1 is the ground potential of 0 V. In this case, as in a period from time t7 to time t9 shown in FIG. 2, the gate voltage VGE of the IGBT Q3 decreases to 0 V, and the IGBT Q3 is turned off.

When the signal level of the output signal from the second output terminal OUT1 is the L level, and the signal level of the output signal from the first output terminal OUT0 is the H level, the output voltage ASOV of the switching circuit S1 is the voltage value V1 of the first voltage source VD1. The voltage values have a relation 0<Vth<GV1<V1. As in a period from time t1 to time t3 and a period from time t9 to time t11 shown in FIG. 2, however, the gate voltage VGE of the IGBT Q3 does not immediately increase to the voltage value V1 of the first voltage source VD1, but increases to a first gate voltage value GV1 in the mirror period from time t2 to time t3a at turn-on.

When the signal level of the output signal from the second output terminal OUT1 is the H level, and the signal level of the output signal from the first output terminal OUT0 is the L level, the output voltage ASOV of the switching circuit S1 is the voltage value V0 of the power supply VCC. In this case, as in a period from time t3 to time t5 shown in FIG. 2, the gate voltage VGE of the IGBT Q3 increases to a second gate voltage value GV2 that is higher than the gate threshold voltage Vth and is higher than the first gate voltage value GV1, and the IGBT Q3 is turned on. The second gate voltage value GV2 is approximately equal to the voltage value V0 of the power supply VCC.

When the signal level of the output signal from the second output terminal OUT1 is the H level, and the signal level of the output signal from the first output terminal OUT0 is the H level, the output voltage ASOV of the switching circuit S1 is the voltage value V2 of the second voltage source VD2. The voltage values have a relation 0<V2<Vth<GV1. As in a period from time t5 to time t7 shown in FIG. 2, however, the gate voltage VGE of the IGBT Q3 does not immediately decrease to 0 V, but decreases to the first gate voltage value GV1 in the mirror period from time t6 to time t7a at turn-off.

The operation of the power device circuit 10 shown in FIG. 1 is described in line with the timing diagram showing in FIG. 2. When the gate drive signal GDS rises, and switches from the off signal to the on signal at time t1, the control logic circuit 12 switches the output voltage ASOV of the switching circuit S1 from 0 V to the voltage value V1 of the first voltage source VD1. Specifically, in response of the rise of the gate drive signal GDS at time t1, the first logic circuit 15 of the control logic circuit 12 starts the first timer TM1 16, and switches the signal level of the first timer TM1 16 from the L level to the H level to raise the signal of the first timer TM1 16.

In response to the rise of the signal of the first timer TM1 16, the second logic circuit 18 of the control logic circuit 12 switches the signal level of the output signal from the first output terminal OUT0 from the L level to the H level to raise the output signal from the first output terminal OUT0. In response to the rise of the output signal from the first output terminal OUT0, the switching circuit S1 switches connection from ground to the first voltage source VD1. As a result, the output voltage ASOV output from the switching circuit S1 switches from the ground potential of 0 V to the voltage value V1 of the first voltage source VD1.

When the output voltage ASOV of the switching circuit S1 becomes the voltage value V1 of the first voltage source VD1 at time t1, the gate voltage VGE of the IGBT Q3 starts to increase. The gate voltage VGE of the IGBT Q3 increases, and reaches the first gate voltage value GV1 at time t2. The higher resistance of the first gate resistor R1 is, the gentler an inclination of a change of the gate voltage VGE of the IGBT Q3 from time t1 to time t2 becomes.

The control logic circuit 12 maintains the output voltage ASOV of the switching circuit S1 at the voltage value V1 of the first voltage source VD1 from time t1 to time t3 when the first maintenance period TV1 has elapsed. Specifically, the control logic circuit 12 measures the first maintenance period TV1 by use of the first timer TM1 16, and maintains the signal levels of the output signals from the first and second output terminals OUT0 and OUT1 until the measurement of the first maintenance period TV1 is completed, i.e., until the first maintenance period TV1 has elapsed since the rise of the gate drive signal GDS from the off signal to the on signal.

Specifically, the signal level of the first timer TM1 16 is maintained at the H level, and the signal level of the second timer TM2 17 is maintained at the L level until the measurement of the first maintenance period TV1 by use of the first timer TM1 16 is completed. As a result, the control logic circuit 12 maintains the signal level of the output signal from the first output terminal OUT0 at the H level, and maintains the signal level of the output signal from the second output terminal OUT1 at the L level.

The end of the first maintenance period TV1, which starts at time t1, is herein set so as to be after time t2 when the IGBT Q3 enters the mirror period and before time t3a when the mirror period ends provided that the output voltage ASOV of the switching circuit S1 remains at the voltage value V1 of the first voltage source VD1.

The control logic circuit 12 switches the output voltage ASOV of the switching circuit S1 from the voltage value V1 of the first voltage source VD1 to the voltage value V0 of the power supply VCC of the drive circuit 1 at time t3 when the first maintenance period TV1 has elapsed since time t1, i.e., while the IGBT Q3 is in the mirror period. As a result, the drive circuit 1 can quickly raise the gate voltage VGE of the IGBT Q3 from the first gate voltage value GV1 to the second gate voltage value GV2 (V0).

Specifically, the first timer TM1 16 of the control logic circuit 12 switches the signal level of the output signal from the H level to the L level upon completion of the measurement of the first maintenance period TV1 at time t3 when the first maintenance period TV1 has elapsed since time t1. That is to say, the signal level of the output signal output from the first timer TM1 16 falls from the H level to the L level at time t3.

In response to the fall of the output signal of the first timer TM1 16, the second logic circuit 18 switches the signal level of the output signal output from the second output terminal OUT1 from the L level to the H level to raise the output signal from the second output terminal OUT1, and switches the signal level of the output signal output from the first output terminal OUT0 from the H level to the L level to lower the output signal from the first output terminal OUT0.

In response to the fall of the output signal from the first output terminal OUT0 and the rise of the output signal from the second output terminal OUT1, the switching circuit S1 switches connection from the first voltage source VD1 to the power supply VCC of the drive circuit 1. As a result, the output voltage ASOV output from the switching circuit S1 switches from the voltage value V1 of the first voltage source VD1 to the voltage value V0 of the power supply VCC of the drive circuit 1, which is higher than the voltage value V1 of the first voltage source VD1.

The gate voltage VGE of the IGBT Q3 remains at the first gate voltage value GV1 from time t2 to time t3. When the output voltage ASOV of the switching circuit S1 becomes the voltage value V0 of the power supply VCC of the drive circuit 1 at time t3, the gate voltage VGE of the IGBT Q3 starts to increase again at time t3a after the elapse of a delay time (a period from time t3 to time t3a). The gate voltage VGE of the IGBT Q3 reaches the second gate voltage value GV2, which is higher than the first gate voltage value GV1, at time t4. The second gate voltage value GV2 is equal to the voltage value V0 of the power supply VCC.

As described above, in a period from time t1 to time t4, the IGBT Q3 is turned on, i.e., switches from the off state to the on state. The period from time t1 to time t4 is referred to as a "turn-on period". In FIG. 2, the turn-on period is indicated by "Ton".

The control logic circuit 12 maintains the output voltage ASOV of the switching circuit S1 at the voltage value V0 of the power supply VCC of the drive circuit 1 from time t3 to time t5 when the gate drive signal GDS switches from the on signal to the off signal. Specifically, the control logic circuit 12 maintains the signal of the first timer TM1 16 at the L level, and maintains the signal of the second timer TM2 17 at the L level. The control logic circuit 12 also maintains the output signal from the first output terminal OUT0 at the L level, and maintains the output signal from the second output terminal OUT1 at the H level.

When the gate drive signal GDS falls, and switches from the on signal to the off signal at time t5, the control logic circuit 12 switches the output voltage ASOV of the switching circuit S1 from the voltage value V0 of the power supply VCC of the drive circuit 1 to the voltage value V2 of the second voltage source VD2.

Specifically, in response of the fall of the gate drive signal GDS at time t5, the first logic circuit 15 of the control logic circuit 12 starts the second timer TM2 17, and switches the signal level of the second timer TM2 17 from the L level to the H level to raise the signal of the second timer TM2 17.

In response to the rise of the signal of the second timer TM2 17, the second logic circuit 18 of the control logic circuit 12 switches the signal level of the output signal output from the first output terminal OUT0 from the L level to the H level to raise the output signal from the first output terminal OUT0. The second logic circuit 18 maintains the signal level of the output signal from the second output terminal OUT1 at the H level.

In response to the rise of the output signal from the first output terminal OUT0, the switching circuit S1 switches connection from the power supply VCC of the drive circuit 1 to the second voltage source VD2. As a result, the voltage ASOV output from the switching circuit S1 switches from the voltage value V0 of the power supply VCC of the drive circuit 1 to the voltage value V2 of the second voltage source VD2.

When the output voltage ASOV of the switching circuit S1 becomes the voltage value V2 of the second voltage source VD2, the gate voltage VGE of the IGBT Q3 starts to decrease as the voltage value V2 of the second voltage source VD2 is lower than the gate threshold voltage Vth. The gate voltage VGE of the IGBT Q3 decreases, and reaches the first gate voltage value GV1 at time t6. The gate voltage value in the mirror period at turn-off of the IGBT Q3 is herein equal to the gate voltage value in the mirror period at turn-on of the IGBT Q3, and is the first gate voltage value GV1. The lower resistance of the second gate resistor R2 is, the gentler a change of the gate voltage VGE of the IGBT Q3 from time t5 to time t6 becomes.

The control logic circuit 12 maintains the output voltage ASOV of the switching circuit S1 at the voltage value V2 of the second voltage source VD2 from time t5 to time t7 when the second maintenance period TV2 has elapsed. The end of the second maintenance period TV2, which starts at time t5, is set so as to be after time t6 when the IGBT Q3 enters the mirror period and before time t7a when the mirror period ends provided that the output voltage ASOV of the switching circuit S1 remains at the voltage value V2 of the second voltage source VD2.

That is to say, the control logic circuit 12 switches the output voltage ASOV of the switching circuit S1 from the voltage value V2 of the second voltage source VD2 to 0 V at time t7 during the mirror period at turn-off of the IGBT Q3. As a result, the drive circuit 1 can quickly lower the gate voltage VGE of the IGBT Q3 from the first gate voltage value GV1 to 0 V.

Specifically, when measurement of the second maintenance period TV2 by use of the second timer TM2 17 of the control logic circuit 12 is completed at time t7, the second timer TM2 17 switches the signal level of the output signal from the H level to the L level. That is to say, at time t7, the signal level of the output signal of the second timer TM2 17 is switched from the H level to the L level, and the output signal of the second timer TM2 17 falls.

In response to the fall of the signal of the second timer TM2 17, the second logic circuit 18 of the control logic circuit 12 switches the signal level of the output signal output from the second output terminal OUT1 from the H level to the L level to lower the output signal from the second output terminal OUT1. The control logic circuit 12 also switches the signal level of the output signal output from the first output terminal OUT0 from the H level to the L level to lower the output signal from the first output terminal OUT0.

In response to the fall of the output signal from the first output terminal OUT0 and the fall of the output signal from the second output terminal OUT1, the switching circuit S1 switches connection from the second voltage source VD2 to ground. As a result, the voltage ASOV output from the switching circuit S1 switches from the voltage value V2 of the second voltage source VD2 to 0 V.

The gate voltage VGE of the IGBT Q3 is maintained at the first gate voltage value GV1 from time t6 to time t7. When the output voltage ASOV of the switching circuit S1 becomes 0 V at time t7, the gate voltage VGE of the IGBT Q3 starts to decrease from the first gate voltage value GV1 again at time t7a after the elapse of a delay time (a period from time t7 to time t7a). During a period of turn-off, charge of the gate of the IGBT Q3 is extracted via the second gate resistor R2, and the gate voltage VGE is lowered. The gate voltage VGE of the IGBT Q3 reaches the ground potential of 0 V at time t8.

As described above, in a period from time t5 to time t8, the IGBT Q3 is turned off, i.e., switches from the on state to the off state. The period from time t5 to time t8 is referred to as a "turn-off period". In FIG. 2, the turn-off period is indicated by "Toff".

The control logic circuit 12 maintains the output voltage ASOV of the switching circuit S1 at 0 V from time t7 to time t9 when the gate drive signal GDS switches from the off signal to the on signal. The gate voltage VGE of the IGBT Q3 is thus maintained at the ground potential of 0 V from time t8 to time t9.

After time t9, an operation that is similar to the above-mentioned operation from time t1 to time t9 is repeated. For example, an operation that is similar to the operation at time t1 is performed at time t9, an operation that is similar to the operation at time t2 is performed at time t10, and an operation that is similar to the operation at time t3 is performed at time t11.

According to the present embodiment described above, the following effects can be obtained. The effects obtained at turn-on of the IGBT Q3 are described first below.

When the gate drive signal GDS switches from the off signal to the on signal, the control logic circuit 12 switches the output voltage ASOV of the switching circuit S1 from the ground potential of 0 V to the voltage value V1 of the first voltage source VD1. The relation between the voltage value V1 of the first voltage source VD1 and the voltage value V0 of the power supply VCC of the drive circuit 1 is V1<V0. In contrast, in the above-mentioned underlying technology, the voltage value V0 of the power supply VCC of the drive circuit 81 is output at the beginning of the turn-on of the IGBT Q33.

Thus, when resistance of the first gate resistor R1 in the present embodiment is the same as resistance of the first gate resistor R31 in the underlying technology shown in FIG. 13, and the IGBTs Q3 and Q33, and the NPN transistors Q1 and Q31 each have the same characteristics, the gate voltage VGE of the IGBT Q3 increases more gently than that in the underlying technology in a period from time t1 to time t2 as shown by a reference sign "20" in FIG. 2.

In the present embodiment, in order to make a speed of the increase in the gate voltage VGE of the IGBT Q3 in a period until the gate voltage VGE reaches the first gate voltage value GV1 from 0 V equal to that in the underlying technology, resistance of the first gate resistor R1 included in the on-side circuit used at turn-on of the IGBT Q3 should be lower than resistance of the first gate resistor R31 included in the on-side circuit in the underlying technology.

After the elapse of the predetermined first maintenance period TV1 since the switch of the gate drive signal GDS from the off signal to the on signal, the control logic circuit 12 switches the output voltage ASOV of the switching circuit S1 to the voltage value V0 of the power supply VCC of the drive circuit 1, and raises the gate voltage VGE of the IGBT Q3 to the voltage value V0 of the power supply VCC of the drive circuit 1. The second gate voltage value GV2 is equal to the voltage value V0 of the power supply VCC of the drive circuit 1.

As described above, in the present embodiment, in order to make the speed of the increase in the gate voltage VGE of the IGBT Q3 in the period until the gate voltage VGE reaches the first gate voltage value GV1 from 0 V equal to that in the underlying technology, the resistance of the first gate resistor R1 should be lower than the resistance of the first gate resistor R31 included in the on-side circuit in the underlying technology.

In this case, when the output voltage ASOV of the switching circuit S1 switches to the voltage value V0 of the power supply VCC of the drive circuit 1, the mirror period for the IGBT Q3 becomes shorter than that in the underlying technology as the raised voltage value is the same (V0), and, in the present embodiment, the resistance of the gate resistor is lower, and a current value supplied to the gate of the IGBT Q3 is higher. A time required for the gate voltage VGE to reach the second gate voltage value GV2 from the first gate voltage value GV1 in the mirror period also becomes shorter.

Thus, a switching time required for the IGBT Q3 to switch from the off state to the on state becomes shorter as the mirror period and the time required for the gate voltage VGE to increase from the first gate voltage value GV1 to the second gate voltage value GV2 are reduced in the present embodiment even when a time required for the gate voltage VGE to increase from 0 V to the first gate voltage value GV1 is the same. As a result, a voltage across the collector and the emitter of the IGBT Q3 at turn-on decreases faster, and thus a switching loss at turn-on can be reduced compared to that in the underlying technology.

The effects obtained at turn-off of the IGBT Q3 are described next below. When the gate drive signal GDS switches from the on signal to the off signal, the control logic circuit 12 switches the output voltage ASOV of the switching circuit S1 from the voltage value V0 of the power supply VCC of the drive circuit 1 to the voltage value V2 of the second voltage source VD2. The voltage value V2 of the second voltage source VD2 is positive (0<V2). In contrast, in the above-mentioned underlying technology, the voltage of 0 V is output at the beginning of the turn-off of the IGBT Q33.

Thus, when resistance of the second gate resistor R2 in the present embodiment is the same as resistance of the second gate resistor R32 in the underlying technology shown in FIG. 13, and the IGBTs Q3 and Q33, and the PNP transistors Q2 and Q32 each have the same characteristics, the gate voltage VGE of the IGBT Q3 decreases more gently than that in the underlying technology in a period from time t5 to time t6 as shown by a reference sign "21" in FIG. 2.

In the present embodiment, in order to make a speed of the decrease of the gate voltage VGE of the IGBT Q3 in a period until the gate voltage VGE reaches the first gate voltage value GV1 from the second gate voltage value GV2 equal to that in the underlying technology, resistance of the second gate resistor R2 included in the off-side circuit used at turn-off of the IGBT Q3 should be lower than resistance of the second gate resistor R32 included in the off-side circuit in the underlying technology.

After the elapse of the predetermined second maintenance period TV2 since the switch of the gate drive signal GDS from the on signal to the off signal, the control logic circuit 12 switches the output voltage ASOV of the switching circuit S1 to 0 V, and lowers the gate voltage VGE of the IGBT Q3 to 0 V.

As described above, in the present embodiment, in order to make the speed of the increase in a period from the first gate voltage value GV 1 to 0 V equal to that in the underlying technology, resistance of the second gate resistor R2 should be lower than resistance of the second gate resistor R32 included in the off-side circuit in the underlying technology. As a result, absorption (sink) of current from the gate of the IGBT Q3 is performed during a period of turn-off of the IGBT Q3, and the ability to decrease (hereinafter, also referred to as the "ability to sink") the gate voltage of the IGBT Q3 to 0 V increases compared to that in the underlying technology.

For example, when two IGBTs are bridge-connected, and one of the IGBTs is switched to an off state and the other one of the IGBTs is switched to an on state or an off state, an output voltage of the one of the IGBTs switched to the off state increases or decreases. When the output voltage of the IGBT increases or decreases, the gate voltage increases via feedback capacitance between an output terminal and a gate terminal of the IGBT.

If the ability to sink the gate voltage of the IGBT to 0 V is low when the IGBT is in an off state, the increase in gate voltage via the feedback capacitance cannot be suppressed. When the gate voltage increases and exceeds the threshold voltage due to the effects of the feedback capacitance, the IGBT that should be in the off state is mistakenly turned on.

In the present embodiment, the ability to sink the gate voltage of the IGBT Q3 to 0 V can be increased by making the switching speed of turn-off equal to that in the underlying technology as described above. As a result, the IGBT Q3 is prevented from mistakenly being turned on due to the effects of the feedback capacitance.

The effects obtained at turn-on are described more specifically. FIG. 3 shows measured waveforms at turn-on in the switching element drive circuit 81 in the underlying technology. FIG. 4 shows measured waveforms at turn-on in the switching element drive circuit 1 in Embodiment 1 of the present invention. In FIGS. 3 and 4, the horizontal axis represents time, and the vertical axis represents a voltage or current. In FIGS. 3 and 4, the gate voltage VGE of the IGBT Q3 and Q33 is indicated by a solid line shown by a reference sign "$V_{GE}$".

With reference to the waveforms in the underlying technology shown in FIG. 3, the duration of a mirror period MP0 during which the gate voltage VGE of the IGBT Q33 becomes flat is approximately 0.90 μs. In the mirror period MP0, a collector-emitter voltage (hereinafter, referred to as an "on voltage") $V_{CE}$ in an on state gradually decreases as shown by a reference sign "25". When resistance of the first gate resistor R31 included in the on-side circuit is increased, the decrease becomes gentle, but a collector-emitter voltage is generated, i.e., collector-emitter resistance of the IGBT Q33 becomes too high to be ignored, and the mirror period MP0 becomes longer, leading to an increase in switching loss.

FIG. 4 shows a case where the voltage value of the first voltage source VD1 and resistance of the first gate resistor R1 included in the on-side circuit in the present embodiment are adjusted so that the switching speed of the IGBT Q3 becomes equal to that in the underlying technology as described above. With reference to the waveforms in the present embodiment shown in FIG. 4, at a position shown by a reference sign "27", the output voltage ASOV of the switching circuit S1 switches to the voltage value V0 of the power supply VCC of the drive circuit 1, and the mirror period MP1 ends.

The duration of the mirror period MP1 is approximately 0.56 μs in the present embodiment, which is shorter than the duration of the mirror period MP0 in the underlying technology. In the mirror period MP1, as shown by a reference sign "26", the on voltage $V_{CE}$ decreases faster than the on voltage $V_{CE}$ in the underlying technology shown in FIG. 3, and becomes almost zero with the end of the mirror period MP1.

The duration of the mirror periods MP0 and MP1 varies depending on the gate current supplied from the drive circuit 1 to the IGBT Q3 and Q33 during the mirror period. The duration of the mirror periods MP0 and MP1 decreases as the gate current increases, and the duration of the mirror periods MP0 and MP1 increases as the gate current decreases.

When the output voltage ASOV of the switching circuit S1 is the same, the gate current increases, and the duration of the mirror periods MP0 and MP1 decreases as resistance of the first gate resistors R1 and R31 included in the on-side circuit decreases. The gate current decreases, and the duration of the mirror periods MP0 and MP1 increases as resistance of the first gate resistors R1 and R31 included in the on-side circuit increases.

As shown in FIGS. 3 and 4, the on voltage $V_{CE}$ gradually decreases in the mirror periods MP0 and MP1. Thus, the switching loss, i.e., the product of the on voltage $V_{CE}$ and the collector current $I_C$, which is the output current, is greater in the mirror periods MP0 and MP1 than after the mirror periods MP0 and MP1. In the present embodiment, the loss at turn-on is reduced by decreasing the duration of the mirror period MP1 more than the duration of the mirror period MP0 in the underlying technology as described above.

Since the output voltage of the drive circuit 81 is constant in the underlying technology, the switching speed changes when resistance of the first gate resistor R31 included in the on-side circuit is increased or decreased. Thus, the duration of the mirror period MP0 and the switching speed cannot be adjusted independently of each other.

In contrast, in the present embodiment, since the output voltage of the drive circuit 1 is changed as described above, the duration of the mirror period MP1 can be decreased more than the duration of the mirror period MP0 in the underlying technology without changing the switching speed. Thus, only the switching loss can be reduced in the present embodiment.

Figure 5:
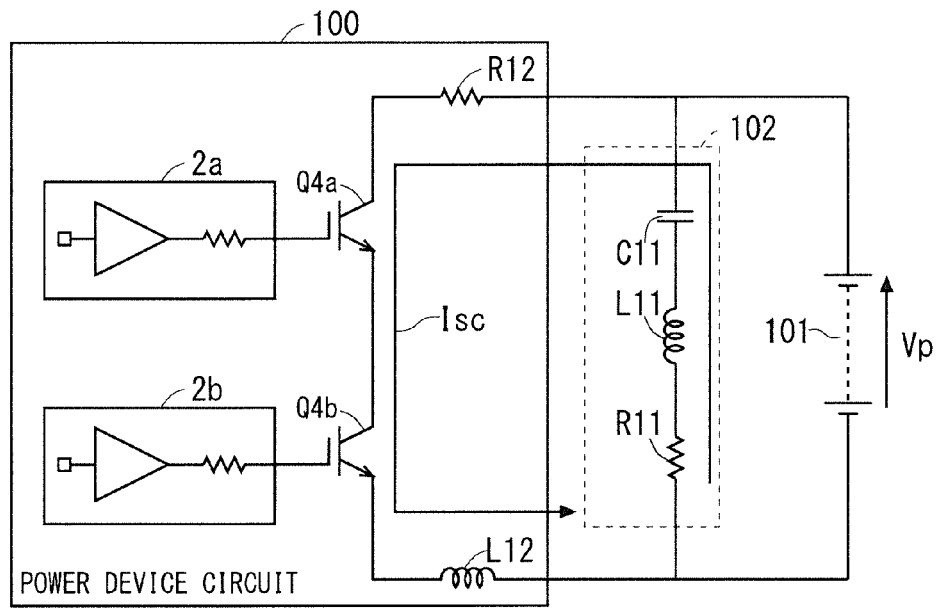
FIG. 5 shows an arm short circuit.

FIG. 5 shows an arm short circuit. FIG. 5 shows a circuit in which IGBTs Q4a and Q4b that correspond to the above-mentioned IGBT Q3 are bridge-connected as switching elements in a High side and a Low side, respectively. A power device circuit 100 shown in FIG. 5 includes first and second gate drive circuits 2a and 2b, first and second IGBTs Q4a and Q4b, an internal resistor R12, and an internal inductance L12.

The first and second gate drive circuits 2a and 2b are circuits corresponding to the above-mentioned gate drive circuit 13, and respectively drive the first and second IGBTs Q4a and Q4b. The first IGBT Q4a is connected to a power supply 101 via the internal resistor R12 of the power device circuit 100. The second IGBT Q4b is connected to the power supply 101 via the internal inductance L12 of the power device circuit 100.

A power supply that outputs a voltage obtained through full-wave rectification of an AC voltage is used as the power supply 101. In order to smooth the full-wave rectified voltage output from the power supply 101, a DC-Link capacitor 102 is connected to the power supply 101 in the circuit shown in FIG. 5.

The DC-Link capacitor 102 is expressed by an equivalent circuit in which a capacitor C11, an internal inductance L11 of the capacitor C11, and an internal resistor R11 of the capacitor C11 are connected in series. The DC-Link capacitor 102 is used in an automobile, such as an electric automobile, that is equipped with a battery as a power supply to suppress voltage fluctuation caused by wiring impedance between an internal resistor of the battery and a circuit including the battery and a switching element.

When a short-time short circuit, called an arm short circuit, in which the IGBTs Q4a and Q4b are simultaneously and momentarily switched to an on state occurs in the circuit shown in FIG. 5 having the above-mentioned configuration, short circuit current $I_{SC}$ expressed by the following equation (1) flows through the first and second IGBTs Q4a and Q4b that constitute the bridge.

[Math 1]

$$I_{SC} = \frac{V}{R}\left(1 - e^{-\frac{R}{L}t}\right) \quad (1)$$

t: duration of arm short circuit
R=R11+R12+R13+R14,
R13, R14=ON resistance of Q4a, Q4b4
L=L11+L12

When the sum R of resistance components of a path through which the short circuit current $I_{SC}$ flows is assumed to be 34 mΩ, the sum L of parasitic inductances of the path is assumed to be 25 nH, and a voltage Vp of the power supply 101 is assumed to be 400 V, the short circuit current $I_{SC}$ that flows 1 μs after the occurrence of the short circuit is calculated using the above-mentioned equation (1) to be 8745 A. This means that the short circuit current $I_{SC}$ increases significantly even if a short circuit lasts for a short time.

When the first and second gate drive circuits 2a and 2b respectively switch the first and second IGBTs Q4a and Q4b from the on state to the off state at a normal switching speed in a case where such relatively large short circuit current $I_{SC}$ occurs as the output current of the IGBTs Q4a and Q4b, a surge voltage is generated, and the first and second IGBTs Q4a and Q4b are adversely affected.

In the above-mentioned configuration using the drive circuit 1 as shown in FIG. 1, the gate drive signal GDS that is properly controlled by a host system and the like is input into the drive circuit 1 so that a state in which an arm short circuit occurs and a state in which the IGBTs Q4a and Q4b are switched from the on state to the off state at the normal switching speed do not overlap each other. As described below, however, the state in which the arm short circuit occurs and the state in which the switching elements are switched from the on state to the off state at the normal switching speed can accidentally overlap each other when noise occurs in the gate drive signal GDS.

Figure 6:
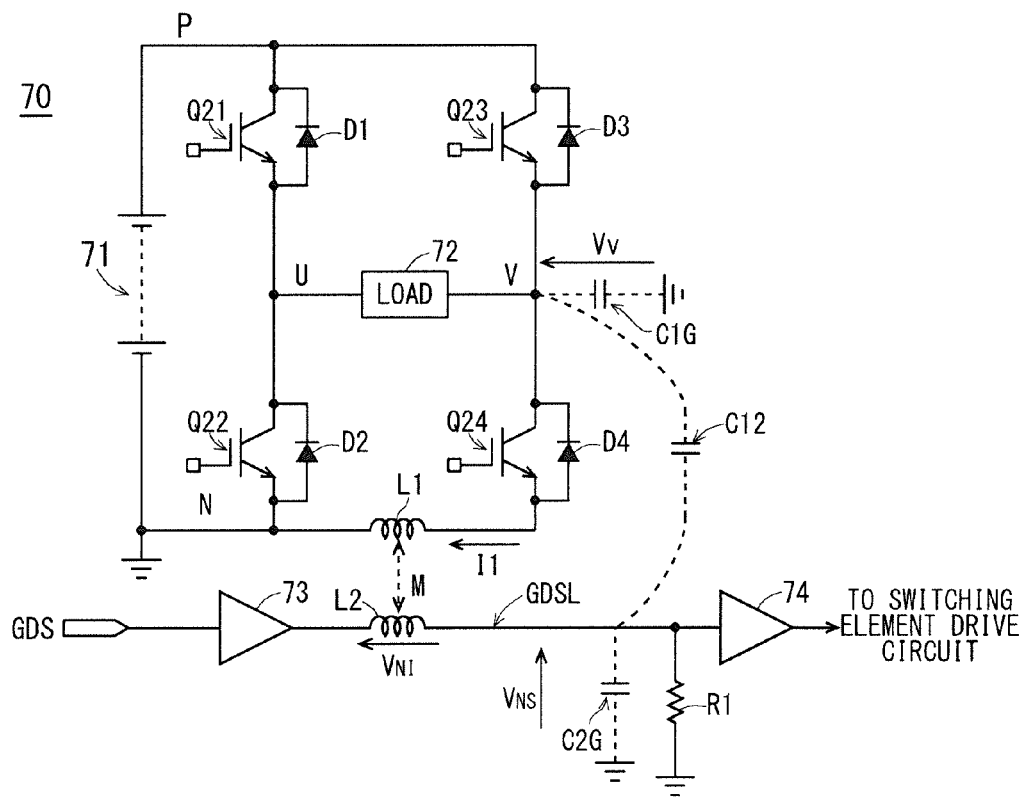
FIG. 6 is a diagram for describing a mechanism for generating noise in a gate drive signal.
Figure 7:
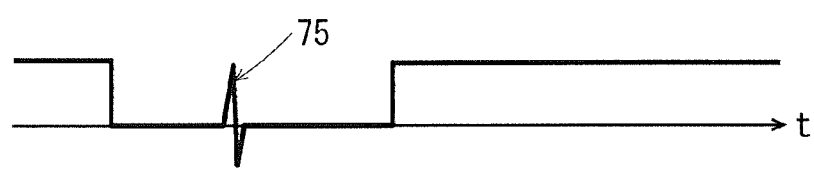
FIG. 7 shows one example of a voltage waveform of a gate drive signal on which noise is superimposed.

The following describes a mechanism for inducing noise in wiring (hereinafter, referred to as "gate drive signal wiring GDSL") for inputting the gate drive signal GDS into the drive circuit 1. FIG. 6 is a diagram for describing the mechanism for generating noise in the gate drive signal. FIG. 7 shows one example of a voltage waveform of a gate drive signal on which noise is superimposed.

An inverter circuit 70 shown in FIG. 6 includes a power supply 71, a load 72, four IGBTs Q21, Q22, Q23, and Q24, and four diodes D1, D2, D3, and D4. The inverter circuit 70 is configured as an H-shaped bridge circuit (hereinafter, also referred to as an "H bridge circuit") in which the four IGBTs Q21, Q22, Q23, and Q24 and the diodes D1-D4 are connected in two stages in tandem. The IGBTs Q21, Q22, Q23, and Q24 are connected to the diodes D1, D2, D3, and D4, respectively. The diodes D1-D4 are flyback diodes. FIG. 6 shows a mechanism for inducing noise in the gate drive signal wiring GDSL due to an operation of the H bridge circuit.

The four IGBTs Q21, Q22, Q23, and Q24 included in the inverter circuit 70 are driven by the drive circuit 1 shown in FIG. 1. The load 72 is configured as a motor, for example.

The IGBTs Q21, Q22, Q23, and Q24 correspond to the IGBT Q3 shown in FIG. 1 or external switching elements. When the IGBTs Q21, Q22, Q23, and Q24 perform switching operation, noise $V_{NS}$ that is an induced voltage generated by electrostatic coupling via a floating capacitor C12 and noise $V_{NI}$ that is an induced voltage generated by electromagnetic coupling via mutual inductance M between the gate drive signal wiring GDSL and the H bridge circuit are superimposed onto the gate drive signal GDS as shown in FIG. 6. The noise $V_{NS}$ generated by the electrostatic coupling is shown by the following equation (2). The noise $V_{NS}$ generated by electrostatic coupling at a high frequency is shown by the following equation (3). The noise $V_{NI}$ generated by the electromagnetic coupling is shown by the following equation (4).

[Math 2]
$$V_{NS} = \frac{j\omega C12}{j\omega(C12 + C2G) + 1/R1} V_V \quad (2)$$

[Math 3]
$$V_{NS} = \frac{C12}{C12 + C2G} V_V \quad (3)$$

[Math 4]
$$V_{NI} = j \times \omega \times M \times I1 \quad (4)$$

FIG. 7 shows one example of a voltage waveform of the gate drive signal GDS on which noises $V_{NS}$ and $V_{NI}$ are superimposed. When the switching speeds of the IGBTs Q21-Q24 increase, and a voltage and current fluctuate in a shorter time, the amplitude of the voltage waveforms of the noises $V_{NS}$ and $V_{NI}$ increases, and a time of occurrence thereof becomes shorter. That is to say, when the switching speeds of the IGBTs Q21-Q24 increase, noise is more likely to be superimposed onto the gate drive signal GDS, and the pulse width of the noise becomes shorter.

A switching time of a switching element in an inverter apparatus is equal to or shorter than 1 µs, for example, and the pulse width of noise decreases accordingly so as to be equal to or shorter than 1 µs. Thus, noise as shown in FIG. 7 that is shorter than a response time of the drive circuit 1, i.e., that has a short pulse width, can be input into the drive circuit 1 while being superimposed onto the gate drive signal GDS.

In a case where such noise is input, even if a soft cutoff circuit 42 is provided to the drive circuit 1 as in a drive circuit 35 shown in FIG. 9 described later, a protection operation by a soft cutoff function of the drive circuit 1 is performed not in time, and normal turn-off is performed by the gate drive circuit 13.

As a result, in the drive circuit 1, the state in which the IGBT Q3 is switched from the on state to the off state at the normal switching speed due to the above-mentioned noise and the state in which the arm short circuit occurs can accidentally overlap each other. In this case, a large surge voltage can be generated, and the IGBT Q3 and the like can adversely be affected.

When an arm short circuit or a load short circuit occurs immediately after turn-on of the IGBT Q3, excessive short circuit current flows. This short circuit current increases a voltage (hereinafter, referred to as an "output terminal voltage") at an output terminal of a power device circuit. In a case where the power device is an IGBT as in the present embodiment, a collector voltage increases. When the collector voltage of the IGBT Q3 increases as described above, the gate voltage increases via feedback capacitance between the output terminal and the gate terminal of the IGBT Q3. The increase in gate voltage further increases the short circuit current.

In the present embodiment, the input voltage into the NPN transistor Q1 and the PNP transistor Q2, which are the gate drive elements, becomes the voltage value V1 of the first voltage source VD1 immediately after turn-on of the IGBT Q3. When the gate voltage of the IGBT Q3 exceeds the voltage value V1 of the first voltage source VD1 due to a short circuit occurring immediately after the turn-on, the PNP transistor Q2, which is the gate drive element, is turned on. Thus, the gate voltage of the IGBT Q3 sinks to the voltage value V1 of the first voltage source VD1, and an increase in gate voltage can be suppressed.

In the underlying technology, however, the voltage input into the NPN transistor Q31 and the PNP transistor Q32, which are the gate drive elements, immediately after the turn-on is the voltage value of the power supply VCC of the drive circuit 81. The PNP transistor Q32, which is the gate drive element, is not turned on until the gate voltage of the IGBT Q33 exceeds the voltage value of the power supply VCC of the drive circuit 81.

Figure 8:
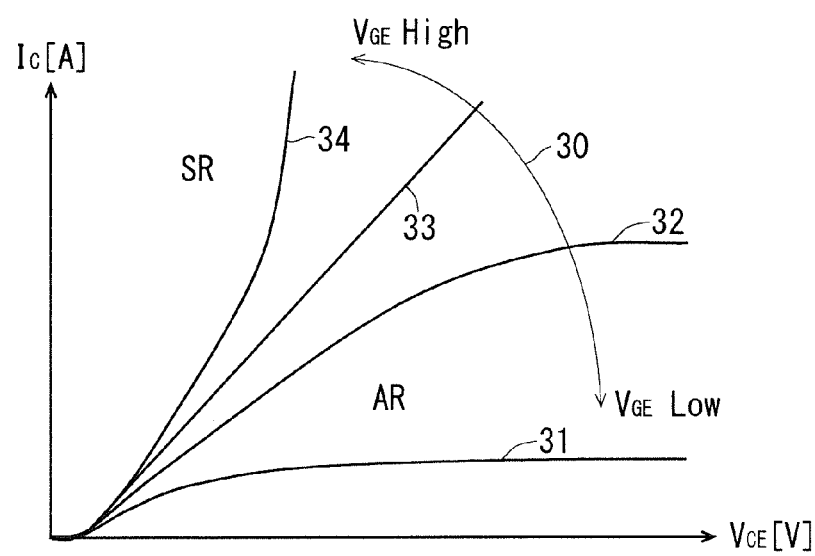
FIG. 8 is a graph showing one example of output characteristics of an IGBT Q3.

FIG. 8 is a graph showing one example of output characteristics of the IGBT Q3. In FIG. 8, the horizontal axis represents the on voltage $V_{CE}$ [V] of the IGBT Q3, and the vertical axis represents the collector current $I_C$ [A].

Providing a sufficiently high gate voltage to the IGBT Q3 results in a saturation state in which an operation is performed in a saturation region SR shown in FIG. 8 (a curve 34). In the saturation state, current that is equal to or higher than a rated value can flow with a relatively low voltage drop $V_{CE}$. Providing a relatively low gate voltage to the IGBT Q3 (a curve 32) results in an active state in which an operation is performed in an active region AR shown in FIG. 8. In the active state, even if the collector voltage is increased, a collector current $I_C$ that is equal to or higher than a certain value does not flow.

In the drive circuit 81 in the underlying technology, since a high voltage, e.g., the voltage of the power supply VCC, is provided to the bases of the NPN transistor Q31 and the PNP transistor Q32, and a sufficiently high voltage is also provided to the gate of the IGBT Q33 at turn-on, excessive current flows if an arm short circuit occurs at turn-on.

In contrast, in the drive circuit 1 in the present embodiment, the gate voltage of the IGBT Q3 can be maintained at the voltage value V1 of the first voltage source VD1 that is lower than that in the underlying technology in a case where a short circuit occurs immediately after the start of turn-on. Thus, the short circuit current can be reduced compared to the underlying technology, and deterioration and destruction of the IGBT Q3 due to the short circuit current can be prevented.

According to the present embodiment as described above, the voltage of the first voltage source VD1 is provided to the NPN transistor Q1 and the PNP transistor Q2 that constitute the voltage output unit 13 when the IGBT Q3 is switched from the off state to the on state, i.e., when a turn-on operation of turning on the IGBT Q3 is performed. When the first maintenance period TV1 has elapsed, the voltage provided to the NPN transistor Q1 and the PNP transistor Q2, which constitute the voltage output unit 13, is switched by the voltage switching unit 11 to the voltage of the power supply VCC of the drive circuit 1.

As a result, at turn-on of the IGBT Q3, after the voltage of the first voltage source VD1 is temporarily output to the IGBT Q3, the voltage of the power supply VCC of the drive circuit 1 can be output.

Since the voltage value V1 of the first voltage source VD1 is higher than the gate threshold voltage Vth of the IGBT Q3, and is lower than the voltage value V0 of the power supply VCC of the drive circuit 1, the switching speed of the IGBT Q3 can be controlled by the voltage of the first voltage source VD1. Therefore, a loss at switching can be reduced compared to a case where the switching speed of the IGBT Q3 is controlled by the gate resistors R1 and R2 and voltages 0 V and V0 as in the underlying technology.

Furthermore, in a case where a plurality of IGBTs are bridge-connected, short circuit current at the occurrence of the arm short circuit can be suppressed so as to be low. As a result, the following effects can be obtained.

In conventional technology, a maximum energization ability of a switching element, such as an IGBT, has to be limited to limit the short circuit current at the occurrence of the arm short circuit. When the maximum energization ability of the switching element, such as the IGBT, is limited, the on voltage increases, and a power loss at energization increases.

In contrast, in the present embodiment, the short circuit current at the occurrence of the arm short circuit can be suppressed so as to be low without limiting the maximum energization ability of the switching element, such as the IGBT Q3, even when the switching element, such as the IGBT Q3, is mistakenly turned on due to the effects of noise and the like in a period in which a voltage that is lower than the voltage value V0 of the power supply VCC and is higher than the gate threshold voltage Vth is provided to the voltage output unit 13 at turn-on. Therefore, there is no need to use an IGBT having a high on resistance and to add a resistor connected in series to the collector and the emitter of the IGBT in order to limit the maximum energization ability of the switching element, and thus an increase in on voltage can be suppressed, and an increase in power loss at energization can be suppressed.

In addition, the voltage switching unit 11 can easily be integrated. The voltage switching unit 11 thus allows for reduction in size of a mounting circuit compared to conventional configuration including a plurality of voltage output units.

Since the voltage output unit 13 has a voltage amplification factor of 1, the voltage output unit 13 can be configured from relatively few circuit components. Specifically, the voltage output unit 13 can be configured as an emitter follower including a single transistor in each of an on side and an off side, allowing for simplification of circuit configuration and reduction in number of components.

Similar effects can be obtained when the voltage output unit 13 is configured by use of a MOSFET in place of a bipolar transistor, although this configuration is different from that in the present embodiment. In this case, the voltage output unit 13 can be configured as an emitter follower including a single transistor in each of an on side and an off side, allowing for simplification of circuit configuration and reduction in number of components. Therefore, switching characteristics of the IGBT Q3 and suppression of short circuit current can be achieved with a relatively small mounting area.

Although an IGBT is used as a power device working as a switching element in the present embodiment, a MOSFET formed of silicon (Si) and an SiC-MOSFET formed of silicon carbide (SiC) may be used as the power device. A surge voltage tends to increase in the SiC-MOSFET as a turn-on time of the SiC-MOSFET is short. Application of the present embodiment can thus efficiently suppress the surge voltage, and protect a switching element.

In the present embodiment, the voltage of the second voltage source VD2 is provided to the NPN transistor Q1 and the PNP transistor Q2, which constitute the voltage output unit 13, when the IGBT Q3 is switched from the on state to the off state, i.e., a turn-off operation of turning off the IGBT Q3 is performed. When the second maintenance period TV2 has elapsed, the voltage provided to the NPN transistor Q1 and the PNP transistor Q2, which constitute the voltage output unit 13, is switched by the voltage switching unit 11 to the ground potential, specifically, to a voltage of 0 V or a negative voltage. The voltage of 0 V or the negative voltage can thus be output after the voltage of the second voltage source VD2 is temporarily output to the IGBT Q3 at turn-off of the IGBT Q3.

Since the voltage value V2 of the second voltage source VD2 is lower than the gate threshold voltage Vth of the IGBT Q3, the switching speed of the IGBT Q3 can be controlled by the voltage of the second voltage source VD2. Therefore, the loss at switching can be reduced compared to the case where the switching speed of the IGBT Q3 is controlled by the gate resistors R1 and R2 as in the underlying technology.

Since short circuit current at the occurrence of the arm short circuit can be suppressed so as to be low as described above in the present embodiment, there is no need to use an IGBT having a high on resistance and to add a resistor connected in series to the collector and the emitter of the IGBT in order to limit a maximum energization ability of the switching element. Thus, an increase in on voltage can be suppressed, and an increase in power loss at energization can be suppressed.

Furthermore, since the surge voltage can efficiently be suppressed as described above in the present embodiment, the IGBT Q3, which is the switching element, can be protected even if a relatively large surge voltage is generated.

As described above, the voltage switching unit 11 includes the switching circuit S1 and the control logic circuit 12 in the present embodiment. The control logic circuit 12 controls the switching circuit S1 so that a connection destination is switched depending on operations of the first and second timers TM1 16 and TM2 17. The voltage switching unit 11 that provides, at turn-on, the voltage V1 of the first voltage source VD1 to the voltage output unit 13, and, after the elapse of the first voltage maintenance period, switches the voltage provided to the voltage output unit 13 to the voltage V0 of the power supply VCC of the drive circuit 1 can be achieved with simple configuration by configuring the voltage switching unit 11 by use of the first and second timers TM1 16 and TM2 17 as described above. The voltage switching unit 11 that provides, at turn-off, the voltage V2 of the second voltage source VD2 to the voltage output unit 13, and, after the elapse of the second voltage maintenance period, switches the voltage provided to the voltage output unit 13 to the ground potential of 0 V can be achieved with simple configuration.

In the present embodiment described above, output from the output terminals OUT0 and OUT1 of the control logic circuit 12 and a switching operation of the switching circuit S1 are described by taking a specific example, but configuration of the switching circuit S1 is not limited to this example. The switching circuit S1 may have any configuration as long as a voltage can be switched among a plurality of types of voltage, and output to the voltage output unit 13.

Embodiment 2

FIG. 9 shows configuration of a power device circuit 40 including a drive circuit 35 that is a switching element drive circuit in Embodiment 2 of the present invention. The power device circuit 40 includes a power device 44 that is a switching element of a voltage control type, and the drive circuit 35. The drive circuit 35 corresponds to the drive circuit 1, which is the switching element drive circuit in Embodiment 1. In the present embodiment, the drive circuit 35 has a function of driving and protecting the power device 44, and includes a gate drive circuit 43 that drives the power device 44 and a protection circuit that protects the power device 44. The power device 44 in the present embodiment is an IGBT Q14.

The drive circuit 35 includes a voltage switching unit 41, a soft cutoff circuit 42, the gate drive circuit 43, a low pass filter (abbreviation: LPF) 45, an overcurrent detector 46, and a sense resistor Rs. The voltage switching unit 41 includes a control logic circuit 90, a first voltage source VD1, a second voltage source VD2, and a switching circuit S11.

The control logic circuit 90 performs overall control on the soft cutoff circuit 42, the gate drive circuit 43, the LPF 45, the overcurrent detector 46, and the sense resistor Rs, which constitute the drive circuit 35. The control logic circuit 90 includes a gate drive signal input terminal IN, a comparator signal input terminal SC, a soft signal output terminal SOFT, and three output terminals OUT0, OUT1, and OUT2. A gate drive signal GDS for driving the IGBT Q14 is input into the gate drive signal input terminal IN. Output signals output from the output terminals OUT0, OUT1, and OUT2 of the control logic circuit 90 are provided to the switching circuit S11 via a bus 95 composed of three signal lines.

The control logic circuit 90 incorporates therein two logic circuits, i.e., a first logic circuit 91 and a second logic circuit 94, and two timers, i.e., a first timer TM1 92 and a second timer TM2 93. The first timer TM1 92 corresponds to a turn-on timer, and the second timer TM2 93 corresponds to a turn-off timer.

The control logic circuit 90, the soft cutoff circuit 42, the LPF 45, the overcurrent detector 46, and the sense resistor Rs, which are components of the drive circuit 35 shown in FIG. 9 other than the gate drive circuit 43 as a voltage output unit, function as the protection circuit for protecting the IGBT Q14, which is the power device 44. When output current of the power device 44 becomes excessive due to an abnormality, such as an overload and a load short circuit, the protection circuit performs soft cutoff to reduce a surge voltage. The "soft cutoff" herein refers to turning off the power device 44 at a relatively low speed. The protection circuit includes the overcurrent detector 46 and the sense resistor Rs as means for detecting output current of the power device 44.

The soft cutoff circuit 42 includes an NPN transistor Q11 and a soft cutoff gate resistor RGsoft. The base of the NPN transistor Q11 is connected to the soft signal output terminal SOFT of the control logic circuit 90. The collector of the NPN transistor Q11 is connected to one end of the soft cutoff gate resistor RGsoft. The emitter of the NPN transistor Q11 is connected to ground.

When excessive output current (hereinafter, also referred to as "overcurrent") of the power device 44 is not detected, the drive circuit 35 turns off the NPN transistor Q11 through control of the control logic circuit 90. As a result, output of the soft cutoff circuit 42 becomes in a high impedance (HiZ) state in which the IGBT Q14 and other components of the drive circuit 35 are not affected.

On the other hand, when the overcurrent is detected, the drive circuit 35 turns on the NPN transistor Q11 through control of the control logic circuit 90. At the same time, the control logic circuit 90 switches the switching circuit S11 so that the output of the switching circuit S11 becomes in the high impedance (HiZ) state in which the switching circuit S11 is electrically connected to none of a power supply VCC, the first voltage source VD1, the second voltage source VD2, and the ground. In this case, base current is not supplied to an NPN transistor Q12 and a PNP transistor Q13 of the gate drive circuit 43, and the NPN transistor Q12 and the PNP transistor Q13 are switched to an off state. The soft cutoff circuit 42 thus lowers a gate voltage of the IGBT Q14 via the resistor RGsoft, and switches the IGBT Q14 from an on state to the off state for protection.

In the present embodiment, resistance of the soft cutoff gate resistor RGsoft of the soft cutoff circuit 42 is set to be higher than resistance of a gate resistor RG of the gate drive circuit 43. As a result, the gate voltage per unit time decreases more gently in a case where the IGBT Q14 is switched from the on state to the off state by use of the soft cutoff circuit 42 than in a case where the IGBT Q14 is switched from the on state to the off state by use of the gate drive circuit 43.

As described above, the drive circuit 35 is configured to operate the soft cutoff circuit 42 to cause the soft cutoff circuit 42 to perform soft cutoff to switch the IGBT Q14 from the on state to the off state at a switching speed lower than that of the gate drive circuit 43 when overcurrent is detected even if the gate drive signal GDS is an on signal.

The gate drive circuit 43 includes the power supply VCC, the NPN transistor Q12, the PNP transistor Q13, and the gate resistor RG. As with the gate drive circuit 13 in Embodiment 1 described above, the gate drive circuit 43 corresponds to the voltage output unit, and is configured as an amplifier circuit having a voltage amplification factor of 1.

The voltage switching unit 41 has similar configuration to the voltage switching unit 11 in Embodiment 1, and includes the control logic circuit 90, the first voltage source VD1, the second voltage source VD2, and the switching circuit S11. The control logic circuit 90 switches the switching circuit S11 connected to the power supply VCC, the first voltage source VD1, the second voltage source VD2, and the ground to any of output states, i.e., the voltage value V0 of the power supply VCC, the voltage value V1 of the first voltage source VD1, the voltage value V2 of the second voltage source VD2, ground potential of 0 V, and the high impedance (HiZ) state, depending on outputs from the output terminals OUT0, OUT1, and OUT2.

The base of the NPN transistor Q12 is connected to an output terminal of the switching circuit S11. The emitter of the NPN transistor Q12 is connected to the power supply VCC of the gate drive circuit 43.

The base of the PNP transistor Q13 is connected to output of the switching circuit S11 of the control logic circuit 90. The collector of the PNP transistor Q13 is connected to ground. The emitters of the NPN transistor Q12 and the PNP transistor Q13 are commonly connected.

A point at which the emitters of the NPN transistor Q12 and the PNP transistor Q13 are connected is connected to one end of the gate resistor RG. The other end of the gate resistor RG is connected to the other end of the soft cutoff gate resistor RGsoft of the soft cutoff circuit 42. A point at which the other end of the gate resistor RG and the other end of the soft cutoff gate resistor RGsoft of the soft cutoff circuit 42 are connected is connected to the gate of the IGBT Q14, which is the power device 44.

In Embodiment 1 described above, as shown in FIG. 1, one end of the first gate resistor R1 and one end of the second gate resistor R2 are respectively connected to the emitter of the NPN transistor Q1 and the emitter of the PNP transistor Q2.

In contrast, in the present embodiment, one end of the single gate resistor RG is commonly connected to the emitters of the NPN transistor Q12 and the PNP transistor Q13. Therefore, in the present embodiment, a turn-on time and a turn-off time of the IGBT cannot be set independently of each other. In a case where appropriate turn-on and turn-off times can be obtained through use of resistance of the single gate resistor RG, however, the voltage output unit can be simplified and reduced in size by using the single gate resistor RG as with the gate drive circuit 43 which is the voltage output unit in the present embodiment.

When overcurrent is not detected, the control logic circuit 90 outputs a signal for switching the switching circuit S11 from the output terminals OUT0, OUT1, and OUT 2 in response to the gate drive signal GDS. Specifically, the control logic circuit 90 switches an output voltage of the switching circuit S11 in accordance with operations of the first timer TM1 92 and the second timer TM2 93 as with the output voltage ASOV of the voltage switching unit 11 in Embodiment 1 as shown in the timing diagram of FIG. 2.

On the other hand, when overcurrent is detected, output of the switching circuit S11 is made to be in the high impedance (HiZ) state to turn off the NPN transistor Q12 and the PNP transistor Q13 and thereby to make output of the gate drive circuit 43 to be in the high impedance (HiZ) state in which IGBT Q14 and other components of the drive circuit 35 are not affected.

An output state of the switching circuit S11 is any of a total of five states, i.e., the voltage value V0 of the power supply VCC, the voltage value V1 of the first voltage source VD1, the voltage value V2 of the second voltage source VD2, the ground potential of 0 V, and the high impedance (HiZ) state. In the present embodiment, the switching circuit S11 is thus switched by the bus 95 composed of three signal lines connected to the respective three output terminals OUT0, OUT1, and OUT2.

An emitter terminal E of the IGBT Q14 is connected to ground. A current sense terminal S of the IGBT Q14 is connected to one end of the sense resistor Rs. The other end of the sense resistor Rs is connected to ground.

The sense resistor Rs is connected to the current sense terminal S of the IGBT Q14. Sense current that is one several thousandth to one several ten-thousandth of current flowing through the emitter terminal E of the IGBT Q14 flows through the current sense terminal S. The drive circuit 35 judges whether output current of the IGBT Q14 is excessive or not through use of the sense current, and, when the output current is excessive, gradually cuts off the current by use of the soft cutoff circuit 42 to suppress a surge voltage at a cutoff operation, and thereby to prevent destruction of the IGBT Q14. In the present embodiment, the sense current is converted into a sense voltage Vs by use of the sense resistor Rs.

Although configuration in which the IGBT Q14 includes the current sense terminal S is described in the present embodiment, the IGBT Q14 may not include the current sense terminal S. In a case where the IGBT Q14 does not include the current sense terminal S, a shunt resistor for current detection should be connected between the ground and the emitter terminal E to convert emitter current into the sense voltage.

Resistance of the sense resistor Rs or the shunt resistor should be set so that a voltage drop of the sense resistor Rs or the shunt resistor becomes equal to a reference voltage VREF of a reference voltage source REF when output current $I_C$ of the IGBT Q14 exceeds a rated value.

The LPF 45 includes a filter resistor 47 and a filter capacitor 48. One end of the filter resistor 47 is connected to one of electrodes of the filter capacitor 48. The other end of the filter resistor 47 is connected to a point at which the current sense terminal S of the IGBT Q14 and the sense resistor Rs are connected. The other one of the filter capacitor 48 is connected to ground. The LPF 45 eliminates a noise component superimposed onto the sense voltage Vs obtained through conversion by the sense resistor Rs, and outputs the sense voltage Vs resulting from the elimination to a comparator 49 of the overcurrent detector 46.

The overcurrent detector 46 includes the reference voltage source REF and the comparator 49. The overcurrent detector 46 detects whether the output current $I_C$ of the IGBT Q14 is excessive or not. A non-inverting input terminal of the comparator 49 is connected to a point at which the one end of the filter resistor 47 and the one electrode of the filter capacitor 48 of the LPF45 are connected. An inverting input terminal of the comparator 49 is connected to a positive terminal of the reference voltage source VREF. A negative terminal of the reference voltage source VREF is connected to ground. An output terminal of the comparator 49 is connected to the comparator signal input terminal SC of the control logic circuit 90.

The comparator 49 compares the sense voltage Vs from the LPF 45 and the reference voltage VREF of the reference voltage source REF, and outputs a signal (hereinafter, also referred to as a "comparator signal") according to the results of comparison to the comparator signal input terminal SC of the control logic circuit 90.

In the present embodiment, when the sense voltage Vs is equal to or lower than the reference voltage VREF, the comparator 49 outputs a comparator signal at an L level to the comparator signal input terminal SC of the control logic circuit 90. When the sense voltage Vs exceeds the reference voltage VREF, the comparator 49 outputs a comparator signal at an H level to the comparator signal input terminal SC of the control logic circuit 90.

The reference voltage VREF is herein set to be equal to or lower than 1 V, for example, so that an operation of the IGBT Q14 is not affected by a voltage drop caused by the sense resistor Rs or the shunt resistor.

The control logic circuit 90 controls the soft cutoff circuit 42 and the gate drive circuit 43 based on the gate drive signal GDS input into the gate drive signal input terminal IN and the comparator signal input into the comparator signal input terminal SC.

Specifically, when the signal level of the comparator signal input into the comparator signal input terminal SC is the L level, in other words, when the output current $I_C$ of the IGBT Q14 is not excessive, and the sense voltage Vs is equal to or lower than the reference voltage VREF, the control logic circuit 90 performs an operation to turn on and off the IGBT Q14 by use of the gate drive circuit 43 in accordance with an on signal and an off signal, which are each the gate drive signal GDS.

On the other hand, when the signal level of the comparator signal input into the comparator signal input terminal SC is the H level, in other words, when the output current $I_C$ of the IGBT Q14 is excessive, and the sense voltage Vs exceeds the reference voltage VREF, the control logic circuit 90 switches the IGBT Q14 from the on state to the off state at a switching speed lower than that of the gate drive circuit 43 by use of the soft cutoff circuit 42 even if the gate drive signal GDS is the on signal.

That is to say, the drive circuit 35 operates the soft cutoff circuit 42 when overcurrent is detected by the overcurrent detector 46. According to the power device circuit 40 including the drive circuit 35 as described above, a surge voltage can suppressed.

When the drive circuit 35 operates the soft cutoff circuit 42 through control of the control logic circuit 90, the output terminal OUT of the control logic circuit 90 is made to be in the high impedance (HiZ) state to turn off the NPN transistor Q12 and the PNP transistor Q13 of the gate drive circuit 43 and thereby to make the output of the gate drive circuit 43 to be in the high impedance (HiZ) state, so as not to prevent an operation of the soft cutoff circuit 42.

When the drive circuit 35 operates the gate drive circuit 43 through control of the control logic circuit 90, the NPN transistor Q11 of the soft cutoff circuit 42 is turned off to make output SBCO of the soft cutoff circuit 42 to be in the high impedance (HiZ) state, so as not to prevent driving of the IGBT Q14 by the gate drive circuit 43.

As such, the drive circuit 35 suppresses interaction between operations of the soft cutoff circuit 42 and the gate drive circuit 43.

Table 2 shows a relation among signal levels of signals input into the gate drive signal input terminal IN and the comparator signal input terminal SC of the control logic circuit 90, output states of the first timer TM1 92 and the second timer TM2 93 inside the control logic circuit 90, an output state of the soft signal output terminal SOFT of the control logic circuit 90, the output voltage ASOV of the switching circuit S11 switched by output signals from the output terminals (hereinafter, also referred to as "signal output terminals") OUT0, OUT1, and OUT2 of the control logic circuit 90, a state of the NPN transistor Q11, output of the gate drive circuit 43, and a state of the IGBT Q14.

When the gate drive signal GDS input into the gate drive signal input terminal IN is at the L level, and the comparator signal input into the comparator signal input terminal SC is at the L level, a signal output from the soft signal output terminal SOFT is at the L level, and the output voltage ASOV of the switching circuit S11 becomes 0 V due to the signals output from the signal output terminals OUT0, OUT1, and OUT2. As a result, the NPN transistor Q11 is turned off, the output SBCO of the soft cutoff circuit 42 becomes in the high impedance (HiZ) state, the output voltage of the gate drive circuit 43 becomes 0 V, and thus the IGBT Q14 is turned off.

When the gate drive signal GDS input into the gate drive signal input terminal IN is at the H level, and the comparator signal input into the comparator signal input terminal SC is at the L level, the first timer TM1 92 is started, output of the first timer TM1 92 becomes at the H level, the signal output from the soft signal output terminal SOFT becomes at the L level, and the output voltage ASOV of the switching circuit S11 becomes the voltage value V1 of the first voltage source VD1 due to the signals output from the signal output terminals OUT0, OUT1, and OUT2. As a result, the NPN transistor Q11 is turned off, the output SBCO of the soft cutoff circuit 42 becomes in the high impedance (HiZ) state, the output voltage of the gate drive circuit 43 becomes the voltage value V1 of the first voltage source VD1, and thus the IGBT Q14 starts the turn-on operation.

When the output of the first timer TM1 92 becomes at the L level with the elapse of the first maintenance period, the output voltage ASOV of the switching circuit S11 switched by the signals output from the signal output terminals OUT0, OUT1, and OUT2 becomes the voltage value V0 of the power supply VCC. As a result, the IGBT Q14 is switched to the on state.

When the gate drive signal GDS input into the gate drive signal input terminal IN is at the H level, and the comparator signal input into the comparator signal input terminal SC is at the H level, the signal output from the soft signal output terminal SOFT is at the H level, and thus the NPN transistor Q11 of the soft cutoff circuit 42 is turned on, and a soft cutoff (abbreviation: SC) operation is performed.

The output ASOV of the switching circuit S11 becomes in the high impedance (HiZ) state in which the switching circuit S11 is electrically connected to none of the power supply VCC, the first voltage source VD1, the second voltage source VD2, and the ground, due to the signals output from the signal output terminals OUT0, OUT1, and OUT2, the output of the gate drive circuit 43 becomes in the high impedance (HiZ) state, and the IGBT Q14 performs a turn-off operation.

TABLE 2

| INPUT | | TIMER | | OUTPUT | | ELEMENT STATE | | CIRCUIT 43 | | |
|---|---|---|---|---|---|---|---|---|---|---|
| IN | SC | TM1 | TM2 | SOFT | ASOV | Q11 | OUTPUT | Q14 | REMARKS |
| L | L | L | L | L | 0 V | OFF | 0 V | OFF | IGBT OFF |
| H | L | H | L | L | V1 | OFF | V1 | TURN-ON OPERATION | IGBT TURN-ON PERIOD |
| H | L | L | L | L | V0 | OFF | V0 | ON | IGBT ON |
| L | L | L | H | L | V2 | OFF | V2 | TURN-OFF OPERATION | IGBT TURN-OFF PERIOD |
| H | H | L | L | H | HiZ | ON | HiZ | TURN-OFF OPERATION | SOFT CUTOFF START |
| L | H | L | L | L | 0 V | OFF | 0 V | OFF | SOFT CUTOFF |

When the gate drive signal GDS input into the gate drive signal input terminal IN is at the L level, and the comparator signal input into the comparator signal input terminal SC is at the H level, the signal output from the soft signal output terminal SOFT becomes at the L level, and the output voltage ASOV of the switching circuit S11 switched by the signals output from the signal output terminals OUT0, OUT1, and OUT2 becomes 0 V. As a result, the NPN transistor Q11 of the soft cutoff circuit 42 is turned off, the output of the gate drive circuit 43 becomes 0 V, and thus the IGBT Q14 is turned off. The first maintenance period for the first timer TM1 92 and the second maintenance period for the second timer TM2 93 can be set in a similar manner to that in Embodiment 1.

Figure 10:
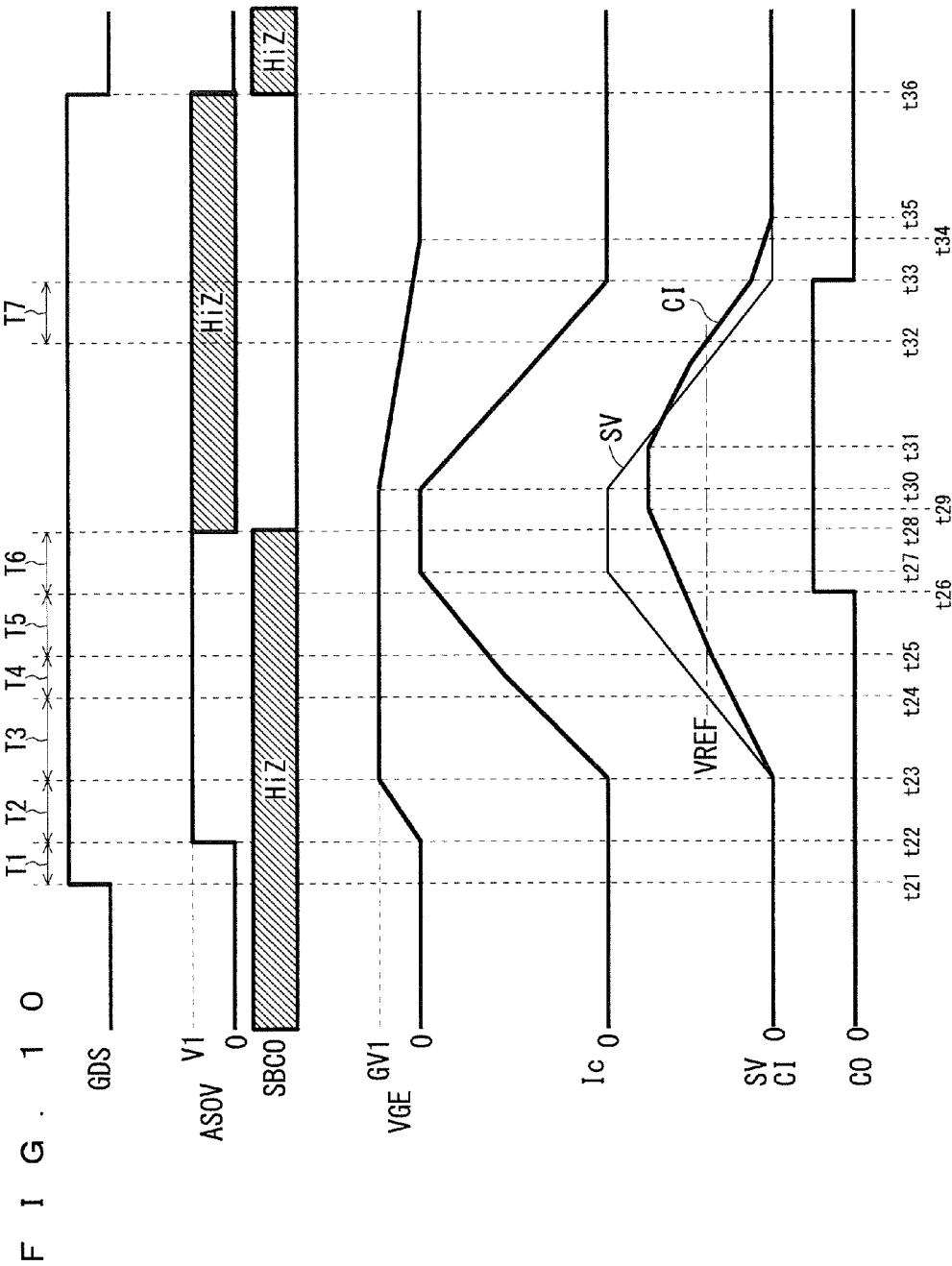
FIG. 10 is a timing diagram showing an operation of the power device circuit 40 shown in FIG. 9.

FIG. 10 is a timing diagram showing an operation of the power device circuit 40 shown in FIG. 9. The horizontal axis in FIG. 10 represents time. FIG. 10 describes a case where overcurrent flows through the IGBT Q14 at turn-on. FIG. 10 also shows a delay time of each circuit and element.

At time t21, the gate drive signal GDS switches from the off signal to the on signal. The output voltage of the switching circuit S11 switches from 0 V to V1 due to the signals output from the output terminals OUT0, OUT1, and OUT2 of the control logic circuit 90 at time t22 when a gate drive output delay time T1 has elapsed since time t21. At time t22, the gate voltage VGE of the IGBT Q14, which is the power device 44, starts to increase.

The gate voltage VGE of the IGBT Q14 reaches the first gate voltage value GV1 in the mirror period for the IGBT Q14, which is the power device 44, at time t23 when a turn-on delay time T2 of the IGBT Q14 has elapsed since time t22. The gate voltage VGE of the IGBT Q14 remains at the first gate voltage value GV1 during a period from time t23 to time t30.

At time t23, the output current $I_C$ of the IGBT Q14, which is the power device 44, starts to increase. The sense voltage SV and the comparator input voltage CI input into the comparator 49 also start to increase.

The sense voltage SV becomes equal to the reference voltage VREF at time t24 when an output current rise time T3 has elapsed since time t23. The comparator input voltage CI reaches the reference voltage VREF at time t25 when an LPF delay time T4 has elapsed since time t24.

A signal level of a comparator output voltage CO output from the comparator 49 switches from the L level to the H level at time t26 when a comparator output delay time T5 has elapsed since time t25.

At time t28 when a control logic circuit output delay time T6 has elapsed since time t26, the signal output from the soft signal output terminal SOFT of the control logic circuit 90 becomes at the H level, and an output state of the switching circuit S11 becomes in the high impedance (HiZ) state due to the signals output from the signal output terminals OUT0, OUT1, and OUT2. As a result, the soft cutoff circuit 42 transitions from the high impedance (HiZ) state to an operating state, and the gate drive circuit 43 transitions from the operating state to the high impedance (HiZ) state.

Due to the operation of the soft cutoff circuit 42, the gate voltage VGE of the IGBT Q14 and the output current $I_C$ of the IGBT Q14 start to decrease at time t30.

At time t28, the output voltage ASOV of the switching circuit S11 remains at V1, which is lower than V0, as the first maintenance period TV1 has not elapsed yet since the start of the first timer TM1 92.

At time t30 when a delay time has elapsed since time t28 when the soft cutoff circuit 42 starts to work (starts to sink), and the gate voltage VGE starts to decrease from the first gate voltage value GV1, the output current $I_C$ of the IGBT Q14 and the sense voltage SV start to decrease. The comparator input voltage CI becomes a constant value at time t29, and starts to decrease at time t31.

At time t33, the output current $I_C$ of the IGBT Q14 becomes zero. At time t33, the sense voltage SV becomes zero. At time t33 when a comparator output delay time T7 has elapsed since time t32 when the comparator input voltage CI becomes VREF, the signal level of the comparator output voltage CO switches from the H level to the L level. At time t34, the gate voltage VGE of the IGBT Q14 becomes zero. At time t35, the comparator input voltage CI becomes zero.

At time t36, the gate drive signal GDS switches from the on signal to the off signal. As a result, the gate drive circuit 43 transitions from the high impedance (HiZ) state to the operating state, and the soft cutoff circuit 42 transitions from the operating state to the high impedance (HiZ) state.

The control logic circuit 90 is in any of six states, i.e., an IGBT off state, an IGBT on state, an IGBT turn-on state, an IGBT turn-off state, a soft cutoff start state, and a soft cutoff state. In a normal operation (SC=L), driving by use of the gate drive circuit 43 is performed, and the IGBT off state and the IGBT on state are alternately switched. In the IGBT on state, when the output of the comparator 49, i.e., the signal level of the signal input into the comparator signal input terminal SC, becomes at the H level, the control logic circuit 90 transitions from the IGBT on state to the soft cutoff start state.

When transitioning to the soft cutoff start state, the control logic circuit 90 turns off the NPN transistor Q12 and the PNP transistor Q13 of the gate drive circuit 43 by use of the switching circuit S11, and turns on the NPN transistor Q11 of the soft cutoff circuit 42. As a result, the soft cutoff circuit 42 operates, and the IGBT Q14 is switched from an on state to the off state at a low switching speed. The control logic circuit 90 transitions from the soft cutoff start state to the soft cutoff state.

When transitioning to the soft cutoff state, the control logic circuit 90 is maintained in the soft cutoff state until the gate drive signal GDS switches from the on signal to the off signal. When the gate drive signal GDS switches from the on signal to the off signal, the control logic circuit 90 transitions to the IGBT off state.

When a short circuit occurs at turn-on of the IGBT Q14 in the power device circuit 40 shown in FIG. 9, a delay that is expressed by the sum of the delay times T1-T6 occurs from the time when the gate drive signal GDS switches from the off signal to the on signal until the soft cutoff operation is performed as shown in FIG. 10.

In the present embodiment, the first maintenance period TV1 for the first timer TM1 92 incorporated in the control logic circuit 90 is set to be the same as or longer than the sum of the delay times T1-T6 until the soft cutoff operation is performed. As a result, a short circuit current value until the protection circuit shown in FIG. 9 operates can be suppressed so as to be lower than that in the drive circuit 81 in the underlying technology, and the destruction of the IGBT can be prevented more reliably.

Furthermore, similar effects to the effects obtained in Embodiment 1 can be obtained in the present embodiment. The above-mentioned description focuses mainly on the operation of the circuit to suppress the short circuit current until the protection circuit works when the short circuit occurs at turn-on of the IGBT. The short circuit often occurs when the IGBT is mistakenly turned on by external noise in the off state of the gate drive signal GDS. It is therefore useful to set the first maintenance period TV1 for the first timer TM1 92 to be the same as or longer than the sum of the delay times T1-T6, and allows for the soft cutoff operation when the IGBT is mistakenly turned on by the external noise for protection of the switching element.

At turn-off, it is also useful to drive the gate voltage in two stages, i.e., the second gate voltage value V2 and the ground potential of 0 V, by use of the second timer TM2 93. As a result, the turn-off time can be reduced, and thus effects of protecting other circuits than the drive circuit that constitute the same arm can be obtained.

Embodiment 3

Figure 11:
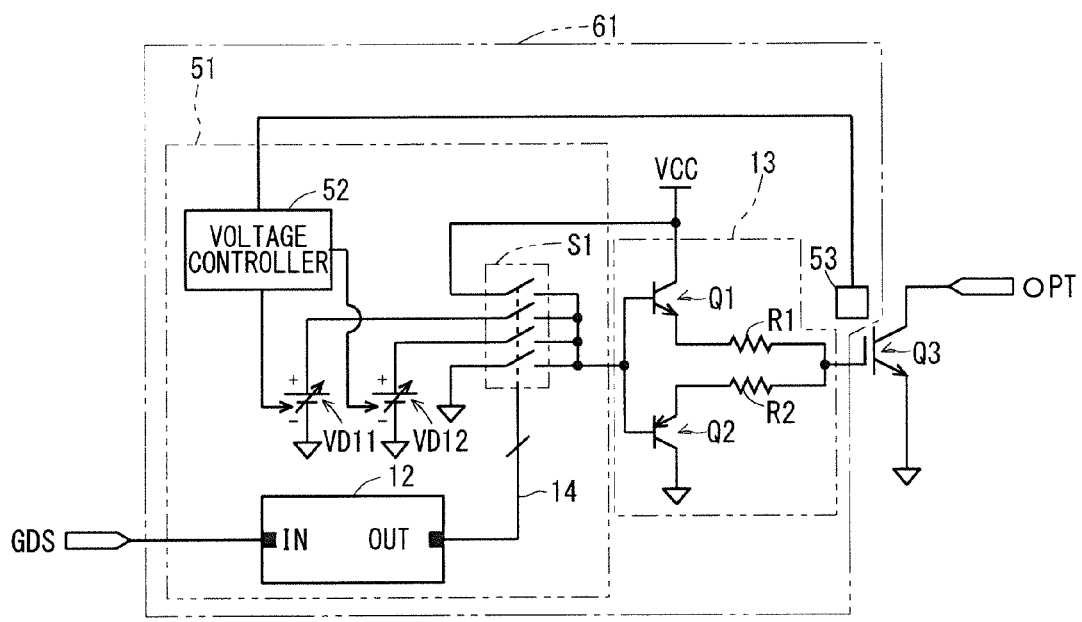
FIG. 11 shows configuration of a power device circuit 50 including a drive circuit 61 that is a switching element drive circuit in Embodiment 3 of the present invention.

FIG. 11 shows configuration of a power device circuit 50 including a drive circuit 61 that is a switching element drive circuit in Embodiment 3 of the present invention. The power device circuit 50 in the present embodiment has similar configuration to the power device circuit 10 in Embodiment 1 described above, and thus only differences are described, and repetition of the description is avoided while providing the same reference signs to the same components. The drive circuit 61 in the present embodiment corresponds to the switching element drive circuit 1 in Embodiment 1.

The power device circuit 50 includes the drive circuit 61 and the IGBT Q3, which is a voltage control type power device. The drive circuit 61 includes a voltage switching unit 51, the power supply VCC, the NPN transistor Q1, the PNP transistor Q2, the first gate resistor R1, the second gate resistor R2, and a temperature sensor 53. The NPN transistor Q1 and the PNP transistor Q2 are gate drive elements. The temperature sensor 53 corresponds to a temperature detector.

The voltage switching unit 51 includes a voltage controller 52, the control logic circuit 12, a first variable voltage source VD11, a second variable voltage source VD12, and the switching circuit S1. The control logic circuit 12 controls the switching circuit S1. The control logic circuit 12 includes the input terminal IN and the two output terminals OUT0 and OUT1. In FIG. 11, the two output terminals OUT0 and OUT1 are collectively shown as "OUT". The output terminal OUT and the switching circuit S1 are connected to each other by the bus 14 composed of two signal lines.

The temperature sensor 53 is connected to the voltage controller 52. The temperature sensor 53 is provided adjacent to the IGBT Q3. The temperature sensor 53 detects a junction temperature of the IGBT Q3. The temperature sensor 53 provides temperature information indicating the detected junction temperature of the IGBT Q3 to the voltage controller 52.

The voltage controller 52 controls and adjusts a voltage temporarily output at turn-on or turn-off, i.e., a value V11 of a first variable voltage output from the first variable voltage source VD11 and a value V12 of a second variable voltage output from the second variable voltage source VD12, in accordance with the junction temperature of the IGBT Q3 indicated by the temperature information provided by the temperature sensor 53.

Specifically, the voltage controller 52 instructs the first variable voltage source VD11 or the second variable voltage source VD12 to output the voltage value V11 or V12 of the variable voltage source VD11 or VD12 to the switching circuit S1.

In a case where the voltage values V11 and V12 of the first and second variable voltage sources VD11 and VD12 are constant values, as the junction temperature of the IGBT Q3 changes, the gate threshold voltage Vth of the IGBT Q3 changes, and thus the switching speed of the IGBT Q3 changes.

The drive circuit 61 in the present embodiment adjusts, by use of the voltage controller 52, the voltage values V11 and V12 of the first and second variable voltage sources VD11 and VD12 in accordance with the junction temperature of the IGBT Q3 detected by the temperature sensor 53. As a result, the switching speed can be maintained constant.

When the switching speed increases, radiation noise and a surge voltage increase, and a switching loss decreases. When the switching speed decreases, the radiation noise and the surge voltage decrease, and the switching loss increases. There is a trade-off between the radiation noise and the surge voltage, and the switching loss.

In configuration in which the switching speed is controlled by use of gate resistors as in the underlying technology, the same number of gate drive elements as the number of gate resistors are required when the gate resistors are switched so as to meet the requirements of the radiation noise and surge voltage, and the switching loss.

In contrast, the drive circuit 61 in the present embodiment is configured such that the voltage values V11 and V12 of the first and second variable voltage sources VD11 and VD12 are adjusted in accordance with the junction temperature of the IGBT Q3 detected by the temperature sensor 53. This facilitates integration into an IC, and reduces a size of a mounting circuit.

The voltage values V11 and V12 of the first and second variable voltage sources VD11 and VD12 should be adjusted, for example, as follows. A gate threshold of an IGBT and a FET, which are power devices, has negative temperature characteristics in that the gate threshold decreases as temperature increases. The drive circuit 61 should decrease the voltage values V11 and V12 of the first and second variable voltage sources VD11 and VD12 with an increase in temperature according to the negative temperature characteristics of the power device.

Although description is made on the switching element drive circuits 1, 35, and 61 and the power device circuits 10, 40, and 50 respectively including the switching element drive circuits 1, 35, and 61 in each of the above-mentioned embodiments, the power device circuits 10, 40, and 50 may be modularized to be power modules including the respective power device circuits 10, 40, and 50. Similar effects to the effects obtained in each of the above-mentioned embodiments can be obtained by such power modules.

Embodiment 4

Figure 12:
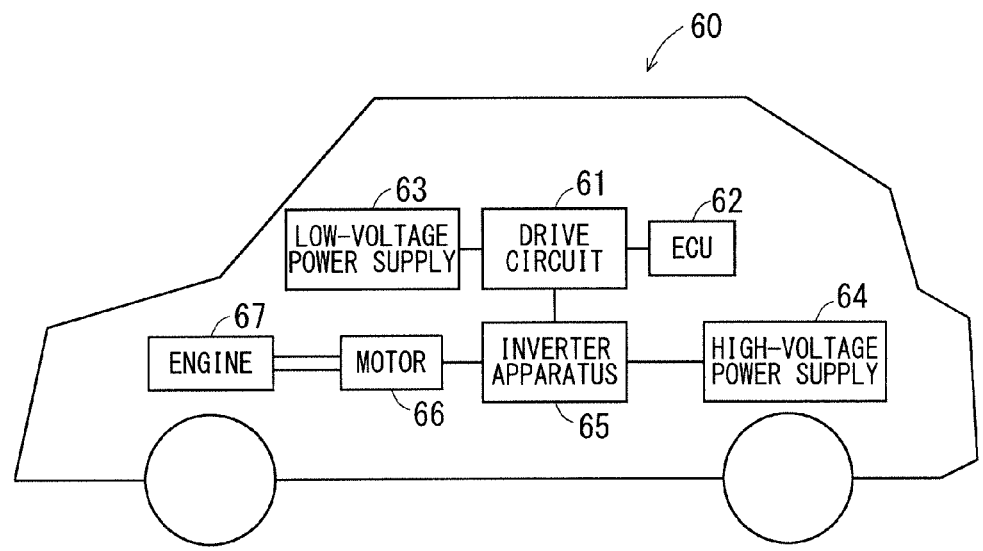
FIG. 12 shows an automobile 60 equipped with the drive circuit 61 in Embodiment 4 of the present invention.

FIG. 12 shows an automobile 60 equipped with the drive circuit 61 in Embodiment 4 of the present invention. The automobile 60 is a hybrid automobile, an electric automobile, a fuel cell powered automobile, or an automobile equipped with a starter generator. The automobile 60 includes the drive circuit 61, an electronic control unit (abbreviation: ECU) 62, a low-voltage power supply 63, a high-voltage power supply 64, an inverter apparatus 65, a motor 66, and an engine 67.

As with the drive circuit 35 in Embodiment 3 described above, the drive circuit 61 corresponds to the switching element drive circuit, and includes a gate drive circuit and a protection circuit that includes a control logic circuit, a soft cutoff circuit, an LPF, an overcurrent detector, and a sense resistor. The drive circuit 61 drives and protects a power device included in the inverter apparatus 65. More specifically, the power device is driven by the gate drive circuit of the drive circuit 61, and is protected by the protection circuit of the drive circuit 61.

The ECU 62 is implemented by a microcomputer. The ECU 62 controls the drive circuit 61. The low-voltage power supply 63 is used as a power supply for the drive circuit 61. The low-voltage power supply 63 is implemented by a battery of 12 V, for example.

The high-voltage power supply 64 is configured to be able to charge and discharge power. Specifically, the high-voltage power supply 64 is a DC power supply that is chargeable and dischargeable, and is implemented, for example, by a secondary battery like a nickel hydrogen battery or a lithium ion battery. A DC power is provided from the inverter apparatus 65 to the high-voltage power supply 64. The high-voltage power supply 64 is thereby charged. The high-voltage power supply 64 is implemented by a battery of 36 V, for example.

The inverter apparatus 65 includes the power device that is driven and protected by the drive circuit 61. The inverter apparatus 65 drives the motor 66. The inverter apparatus 65 converts a DC power discharged from the high-voltage power supply 64 into an AC power for driving the motor 66. The inverter apparatus 65 also converts an AC power generated by the motor 66 into a DC power that can charge the high-voltage power supply 64.

The motor 66 is used in a hybrid automobile, an electric automobile, a fuel cell powered automobile, or an automobile equipped with a starter generator, and is capable of outputting power of 1 kW or more. The motor 66 is implemented by a regenerative motor, for example. The motor 66 generates an AC power. The motor 66 provides the generated AC power to the inverter apparatus 65.

The automobile 60 alternately repeats powering and regeneration, and not only a state in which fluctuation of a load on the motor 66 is large but also a coasting state in which neither powering nor regeneration is performed occur frequently. In such a coasting state, the inverter apparatus 65 that drives the motor 66 is approximately in a no-load running state, and no output current flows at all, or only a small amount of output current that is one several tenth to one several hundredth of rated current flows.

Approximately in the no-load running state as described above, the switching speed of the IGBT included in the inverter apparatus 65 shown in FIG. 12 is higher than that in normal powering and regeneration. As a result, a noise voltage generated by electromagnetic coupling that is attributable to high-frequency current can be superimposed onto the gate drive signal GDS input into the gate drive circuit by the mechanism as shown in FIGS. 6 and 7, leading to a malfunction.

A magnetic shield is effective to prevent the noise voltage generated by electromagnetic coupling that is attributable to high-frequency current, but the magnetic shield is not sufficiently implemented in conventional technology as a shielding material used for the magnetic shield is relatively expensive, and has a problem of an increase in weight.

If the IGBT included in the inverter apparatus 65 shown in FIG. 12 causes an arm short circuit due to the noise voltage, the drive circuit 35 does not work as a pulse width of the noise voltage is shorter that a response time of the drive circuit 35 of the IGBT.

In contract, in the present embodiment, short circuit current can be reduced compared to the underlying technology even if the gate drive signal GDS on which the noise voltage having a relatively short pulse width is superimposed is input into the gate drive circuit. The destruction of the IGBT included in the inverter apparatus 65 shown in FIG. 12 can thus be prevented.

The automobile 60 in the present embodiment includes the drive circuit 61 and the inverter apparatus 65 that are able to prevent the destruction of the IGBT as described above. Thus, the automobile 60 that can prevent the destruction of the IGBT included in the inverter apparatus 65 and can prevent failure of the inverter apparatus 65 even if the gate drive signal GDS on which the noise voltage having a relatively short pulse width is superimposed is input into the gate drive circuit can be achieved.

It should be noted that the present invention can be implemented by freely combining the above-mentioned embodiments within the scope of the present invention. In addition, any components in the above-mentioned embodiments can be modified or omitted as appropriate.

While the present invention has been described in detail, the foregoing description is in all aspects illustrative and not restrictive. It is therefore understood that numerous modifications that have not been described can be devised without departing from the scope of the present invention.

REFERENCE SIGNS LIST

1, 35, 61: switching element drive circuit (drive circuit), 10, 40, 50: power device circuit, 11, 41, 51: voltage switching unit, 12, 90: control logic circuit, 13, 43: gate drive circuit (voltage output unit), 14, 95: bus, 15, 91: first logic circuit, 16, 92: first timer TM1, 17, 93: second timer TM2, 18, 94: second logic circuit, 42: soft cutoff circuit, 44: power device, 45: low pass filter (LPF), 46: overcurrent detector, 52: voltage controller, 53: temperature sensor, 60: automobile, 62: electronic control unit (ECU), 63: low-voltage power supply, 64: high-voltage power supply, 65: inverter apparatus, 66: motor, 67: engine, Q3, Q14, Q21-Q24: IGBT, R1: first gate resistor, R2: second gate resistor, RG: gate resistor, VD1: first voltage source, VD2: second voltage source, VD11: first variable voltage source, VD12: second variable voltage source, S1, S11: switching circuit.

The invention claimed is:

1. A switching element drive circuit that drives a switching element of a voltage control type, the switching element being switched from an off state to an on state by application of a voltage that is equal to or higher than a threshold voltage to a control electrode, the switching element drive circuit comprising:
    a voltage output unit outputting a voltage to said switching element; and
    a voltage switching unit switching a voltage provided to said voltage output unit, wherein
    said voltage output unit is configured as an amplifier circuit having a voltage amplification factor of 1, and
    in performing a turn-on operation of switching said switching element from the off state to the on state, said voltage switching unit provides said voltage output unit with a turn-on voltage having a value that is higher than said threshold voltage of said switching element and is lower than a value of a voltage of a power supply of said switching element drive circuit, and, when a predetermined turn-on voltage maintenance period has elapsed since the provision of the turn-on voltage, switches the voltage provided to said voltage output unit to the voltage of the power supply of said switching element drive circuit.

2. The switching element drive circuit according to claim 1, wherein in performing a turn-off operation of switching said switching element from the on state to the off state, said voltage switching unit provides said voltage output unit with a turn-off voltage having a value that is lower than said threshold voltage of said switching element, and, when a predetermined turn-off voltage maintenance period has elapsed since the provision of the turn-off voltage, switches the voltage provided to said voltage output unit to a voltage of 0 V or a negative voltage.

3. The switching element drive circuit according to claim 1, wherein
said voltage switching unit includes:
   a switching circuit switchably connected to a turn-on voltage source that provides said turn-on voltage or said power supply, and providing a voltage to said voltage output unit; and
   a control logic circuit including a turn-on timer that measures said turn-on voltage maintenance period, and controlling said switching circuit, and
said control logic circuit
   when an on signal representing an instruction to perform said turn-on operation is provided, starts measuring said turn-on voltage maintenance period by use of said turn-on timer, and controls said switching circuit so that said switching circuit is connected to said turn-on voltage source, and
   when the measurement of said turn-on voltage maintenance period by use of said turn-on timer is completed, controls said switching circuit so that said switching circuit switches connection from said turn-on voltage source to said power supply.

4. The switching element drive circuit according to claim 2, wherein
said voltage switching unit includes:
   a switching circuit switchably connected to a turn-on voltage source that provides said turn-on voltage, said power supply, a turn-off voltage source that provides said turn-off voltage, or a low-voltage source that provides the voltage of 0 V or the negative voltage, and providing a voltage to said voltage output unit; and
   a control logic circuit including a turn-on timer that measures said turn-on voltage maintenance period and a turn-off timer that measures said turn-off voltage maintenance period, and controlling said switching circuit, and
said control logic circuit
   (a) when an on signal representing an instruction to perform said turn-on operation is provided, (a1) starts measuring said turn-on voltage maintenance period by use of said turn-on timer, and controls said switching circuit so that said switching circuit is connected to said turn-on voltage source, and, (a2) when the measurement of said turn-on voltage maintenance period by use of said turn-on timer is completed, controls said switching circuit so that said switching circuit switches connection from said turn-on voltage source to said power supply, and
   (b) when an off signal representing an instruction to perform said turn-off operation is provided, (b1) starts measuring said turn-off voltage maintenance period by use of said turn-off timer, and controls said switching circuit so that said switching circuit is connected to said turn-off voltage source, and, (b2) when the measurement of said turn-off voltage maintenance period by use of said turn-off timer is completed, controls said switching circuit so that said switching circuit switches connection from said turn-off voltage source to said low-voltage source.

5. The switching element drive circuit according to claim 1 further comprising
a temperature detector detecting a junction temperature of said switching element, wherein
said voltage switching unit adjusts said turn-on voltage in accordance with said junction temperature detected by said temperature detector.

6. The switching element drive circuit according to claim 2 further comprising
a temperature detector detecting a junction temperature of said switching element, wherein
said voltage switching unit adjusts at least one of said turn-on voltage and said turn-off voltage in accordance with said junction temperature detected by said temperature detector.

7. The switching element drive circuit according to claim 1, wherein
said switching element is included in an inverter apparatus that drives a motor installed in an automobile.

8. A power module comprising
a power device circuit that includes:
   the switching element drive circuit according to claim 1; and
   said switching element driven by said switching element drive circuit.

9. An automobile comprising:
the switching element drive circuit according to claim 1; and
an inverter apparatus including said switching element, and driving a motor.

* * * * *